United States Patent [19]
Devoino et al.

[11] Patent Number: 6,056,428
[45] Date of Patent: May 2, 2000

[54] COMPUTER BASED SYSTEM FOR IMAGING AND ANALYZING AN ENGINEERING OBJECT SYSTEM AND INDICATING VALUES OF SPECIFIC DESIGN CHANGES

[75] Inventors: Igor G. Devoino; Oleg E. Koshevoy, both of Minsk, Belarus; Simon S. Litvin, St. Petersburg, Russian Federation; Valery Tsourikov, Boston, Mass.

[73] Assignee: Invention Machine Corporation, Boston, Mass.

[21] Appl. No.: 08/822,314

[22] Filed: Mar. 21, 1997

Related U.S. Application Data

[63] Continuation of application No. 08/747,922, Nov. 12, 1996.

[51] Int. Cl.[7] .................................................. G06F 17/50
[52] U.S. Cl. ........................ 364/512; 364/488; 364/489; 364/578
[58] Field of Search ...................... 364/468.01, 468.03, 364/468.04, 468.09, 488–489, 490, 491, 512, 578; 345/419, 440, 441, 426, 357

[56] References Cited

U.S. PATENT DOCUMENTS

| | | | |
|---|---|---|---|
| 4,803,641 | 2/1989 | Hardy et al. | 364/513 |
| 4,965,743 | 10/1990 | Malin et al. | 364/513 |
| 5,006,991 | 4/1991 | Ohcoshi et al. | 364/474 |
| 5,016,204 | 5/1991 | Simoudis et al. | 364/578 |
| 5,034,899 | 7/1991 | Schult | 364/518 |
| 5,084,824 | 1/1992 | Lam et al. | 364/490 |
| 5,111,413 | 5/1992 | Lazansky et al. | 364/578 |
| 5,164,911 | 11/1992 | Juran et al. | 364/578 |
| 5,218,557 | 6/1993 | Simoudis | 364/578 |
| 5,436,855 | 7/1995 | Willafys et al. | 364/578 |
| 5,544,067 | 8/1996 | Rostoker et al. | 364/489 |
| 5,546,321 | 8/1996 | Chang et al. | 364/491 |
| 5,572,430 | 11/1996 | Akasaka et al. | 364/468.01 |
| 5,581,663 | 12/1996 | Zlotin et al. | 395/51 |
| 5,623,418 | 4/1997 | Rostoker et al. | 364/489 |
| 5,717,598 | 2/1998 | Miyakawa et al. | 364/468.09 |

OTHER PUBLICATIONS

"CAD For System Design:Is it particular?", IEEE Design & Test of Computers, pp. 46–55, Apr. 1989.

"An Expert System To Aid Quality Planning", Fourth International Conference On Computer Aided Production Engineering, pp. 529–534, 1988.

*Primary Examiner*—Kevin J. Teska
*Assistant Examiner*—Hani M. Kazimi
*Attorney, Agent, or Firm*—Edward Dreyfus, Esq.

[57] ABSTRACT

A software system includes an engineering analysis system (EAS) for analyzing an engineering object system and for recommending elimination of object system components. The EAS includes a functional model unit responsive to user entry for generating images of a functional model of the object system including its components, elements and products and representations of the interactions between the generated components, elements, and products. The functional model can be represented as a number of component/element boxes and harmful and useful interaction lines therebetween, or the functional model components, elements and products can be represented in matrix form with interactions identified in the intersections of the matrix. The EAS includes an advanced link analysis unit for prompting user entry, storing and displaying of (i) a parameter of at least one of said interactions, (ii) the actual and desired quantitative or qualitative values of said parameter, (iii) a time and space dependency of the parameter. A trimming unit responsive to functional model data and interaction evaluation data is provided for generating a trimming recommendation rank for each functional model component and displaying representations of the trimming recommendation rank on the screen as well as the trimmed functional model and the improvement results if the recommended trimming can be accomplished.

17 Claims, 25 Drawing Sheets

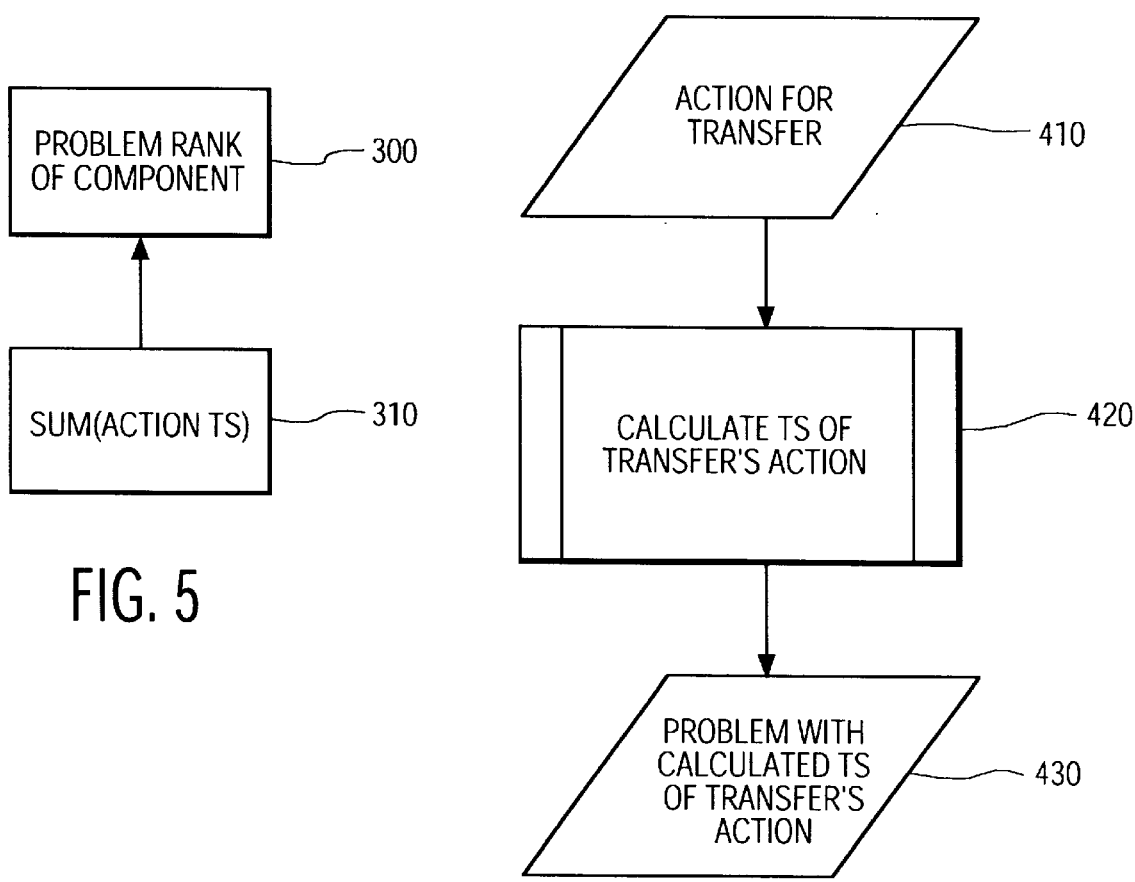
FIG. 5
FIG. 6
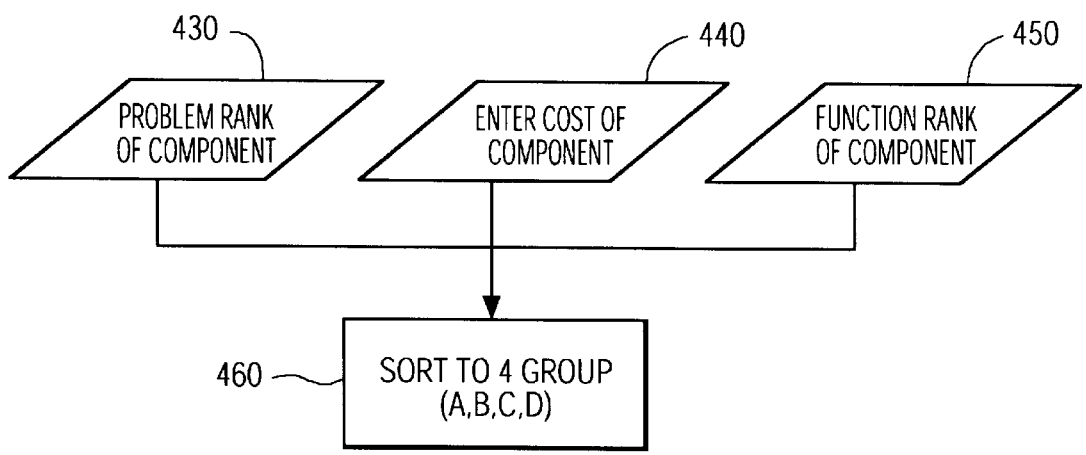
FIG. 7

COMPONENT CAN BE ELIMINATED IF:

1) ITS ACTION IS PERFORMED BY ANOTHER COMPONENT OR SUPERSYSTEM ELEMENT:

2) ITS ACTION IS PERFORMED BY THE COMPONENT WHICH RECEIVES THE ACTION:

3) ITS COMPONENT WHICH RECEIVES THE ACTION IS ALSO ELIMINATED:

THERE ARE TWO WAYS TO TRANSFORM AN ACTION APPLIED TO A TRIMMED ELEMENT:

1) ACTION CAN BE APPLIED TO ANOTHER ELEMENT:

2) ACTION CAN BE DELETED:

COMPUTER BASED SYSTEM FOR IMAGING AND ANALYZING AN ENGINEERING OBJECT SYSTEM AND INDICATING VALUES OF SPECIFIC DESIGN CHANGES

This is a continuation application of copending U.S. patent application Ser. No. 08/747,922 filed Nov. 12, 1996.

BACKGROUND

The present invention relates to engineering problem solving and design tools and more particularly to computer based systems for aiding engineers, scientists and the like to have a greater understanding of the products, processes, or machines they wish to improve and the technical problems related thereto that they wish to solve.

Great advancements have been made in the fields commonly known as computer aided design (CAD) and computer aided engineering (CAE). These computer based systems enable the designer to create detailed images and print-outs of the product or machine he/she is designing or improving. With CAD, the designer can try many new designs or modifications of subsystems and components quickly and view the modified products immediately on the monitor or print-out. The CAD system also generates virtual 3-D images of the product or machine, enables in-space rotation of the product image and zoom through the product image interior.

Although CAD systems are a great designer tool for trying design changes quickly, they do not otherwise aid the designer in the evaluation and solving of technical engineering problems or conceiving new products or processes that provide new functional performance or the same functional performance with completely different engineering approaches. Accordingly, there has arisen a relatively new area of computer based engineering tools known as concept engineering computer based systems. These systems serve to increase the designers inventive and creative abilities in solving engineering and scientific operational or functional problems and, in the course of such problem solving, induce the designer to invent new structural and functional concepts applicable to his/her design goals.

One such concept engineering computer based system is the Invention Machine™ LAB™ Software sold by Invention Machine Corporation of Cambridge, Mass., that comprises a knowledge and logic based system that generates concepts and recommendations for solving engineering problems at the conceptual level. Various inventive rules or procedures are included and certain ones selected and presented to the user to consider in solving the user's current session problem. This system applies to all fields of physics and aids the engineer by solving engineering contradictions to reduce the tendency of user applied engineering trade-offs. In addition, this system includes a large data base of physical, geometric, and chemical effects used in the past to solve other engineering problems and selected ones of the effects are presented to the user to consider for a solution to his/her current problem session. Lastly, this system includes a technology evolution and prediction capability that aids the user in understanding the dynamics of his/her product evolution and the logical next or future generation of the product or its function. This stimulates the user to think forward and extrapolate the dynamics of the technology life cycle and originate the next generation of technology.

Although the above conceptual engineering system has experienced much acceptance by the technical community, there is still a need for a computer based system that aids the user in understanding the nature and value aspects of the current product, machine, or process the engineer wishes to design or re-design. In addition, there is a need for the user to be aided in formulating the statement of the most important technical problems for elimination of components or harmful actions between components of the object system being analyzed.

SUMMARY OF EXEMPLARY EMBODIMENT OF INVENTION

The present invention pertains to a computer based conceptual engineering analysis software system and method (EAS) that satisfies the above described needs and provides other benefits described below. The EAS, according to the principles of the present invention, assists the user to input and displays a functional model of the object system under analysis, which functional model includes the major components, supersystems, products and both useful and harmful interactions between them.

The EAS prompts the user to input data that enables the EAS to perform a parameter analysis of the various interactions. The EAS then analyzes the functional model elements, conducts an interaction parameter analysis, conducts an object system component function and problem and task significance ranking subroutine, and automatically displays recommendation of which components should be changed or eliminated from the object system to achieve the greatest redesign value and which functions transferred to other remaining components.

The EAS includes an Initial Data routine that prompts the user to input analysis or session qualitative and quantitative objectives in re-designing an engineering system or object. After entering initial data, the EAS next prompts user to create an image of a functional model of the object system, learn what parts this object consists of, and how these parts interact with each other and with the environment. It is then possible to decide where the bottle neck is, what problems should be solved, and what is the urgency of the problems. Next a Functional Model routine displays an image of a functional model of the current session object and allows the user to edit it or complete the statement to generate the functional and interaction relationships of components of the current object system the user wishes to modify or redesign. The Functional Model routine includes three alternate modes to enable the user to build the functional model, namely, a graph mode in which the user builds the functional model directly on the screen by entering boxes representing components, products and supersystems or an expert or table mode in which the user is prompted to enter each component, product and supersystem. With such data entered, the EAS will display automatically the graphic form of the functional model if desired by the user.

The EAS also prompts user to apply to the functional model or an interaction matrix the harmful effects and useful interactions between specific components and any supersystems affected by and products produced by the object system. The FAS also prompts user to input the actual, desired and ideal values of harmful and useful interactions and parameter dependencies. The EAS then analyzes the model components and interactions and formulates a list of specifically numbered problems and sorts them according to urgency or priority.

The EAS provides a Trimming routine during which the object system functional model is analyzed, evaluated, and the functions and problems of each object system component ranked in importance. The user checks results and enters the cost of each component. The system re-analyzes the object system and recommends the components that can or should be simplified or trimmed (omitted) and certain trimming conditions.

The EAS conducts each analysis on either of two levels of depth as selected by the user, namely express, short analysis level or advanced, detailed analysis level, as described below. Different levels of analysis for different interactions of the same object can also be conducted. After analyses are completed, the system presents the engineering system characteristics before trimming and after trimming and the percent of improvement of each characteristic.

As can be seen below, the EAS, according to the present invention indicates to the user new and powerful information about the object, each component of the object, and each interaction between such components and each super system and any products produced or conveyed by the object. In addition, the EAS hereof in a Problem Management routine indicates to the user which components to try to modify or trim and eliminate their functions or transfer their functions to other components of the object system. The results also aid the user in identifying the core technical problems to be solved to produce the greatest value and the technical problems that disappear and need no solution if the trimming effort is successful. In addition, the EAS also includes the ability to generate a report at the end of each session describing all analysis steps, the original and trimmed object system, lists of detected problems, received concepts, object structure changes, feature transfer recommendations and results of the session.

DRAWINGS

Other and further aspects, benefits and objectives will become apparent with the following detailed description when taken in view of the appended drawings in which:

FIG. 5 is a block diagram of the component Problem Rank routine.

FIG. 6 is a block diagram of the routine for calculating a task significance for a new technical problem arising from a EAS recommended Action for Transfer.

FIG. 7 is a block diagram of the routine for generating the EAS component trimming recommendation.

FIG. 10 is a visual display device screen illustrating a display for inputting data and displaying further advanced project data.

FIG. 11 is a visual display device screen illustrating a display for inputting data and displaying the team member file.

FIG. 22 is a visual display device screen illustrating a display for inputting data and displaying trimming parameter evaluation problem rank.

FIG. 23 is a visual display device screen illustrating a display for inputting data and displaying trimming parameter evaluation cost evaluation.

FIG. 33 is a visual display device screen illustrating a display for inputting data and displaying browser mode functional model table.

FIG. 34 is a visual display screen illustrating a display screen for inputting data and displaying the Problem Manager task.

FIG. 35 is a visual display screen illustrating a display screen for inputting data and displaying the first screen of the feature transfer routine.

FIG. 36 is a visual display screen illustrating a display screen for inputting data and displaying feature transfer object data.

FIG. 41 is a visual display screen illustrating a display screen for inputting data and displaying feature transfer alternative approach function analysis.

FIG. 42 is a visual display screen illustrating a display screen for inputting data and displaying feature transfer alternative approach element analysis.

FIGS. 44 A–E are representations of EAS trimming rules.

Figure 45:
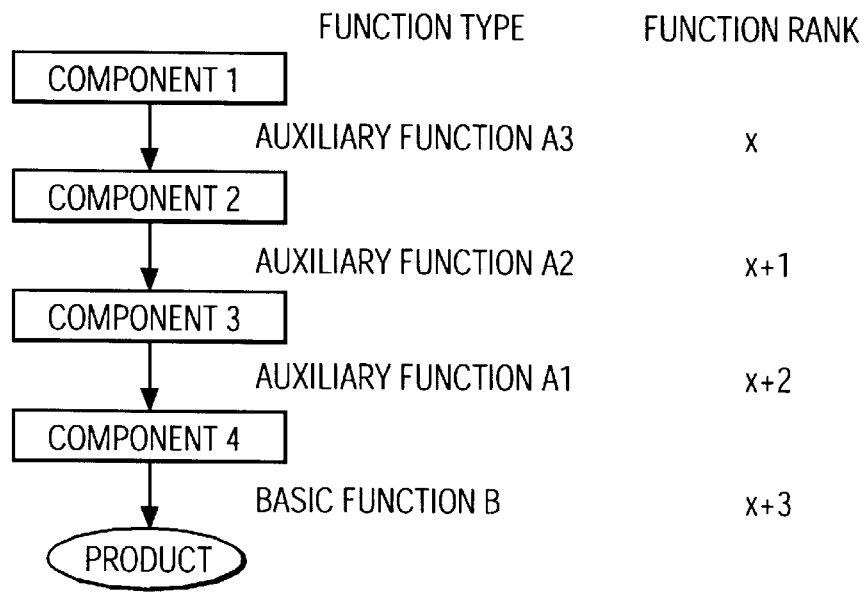

FIG. 45 is a diagram of a Function rank of component calculation.

Figure 46:
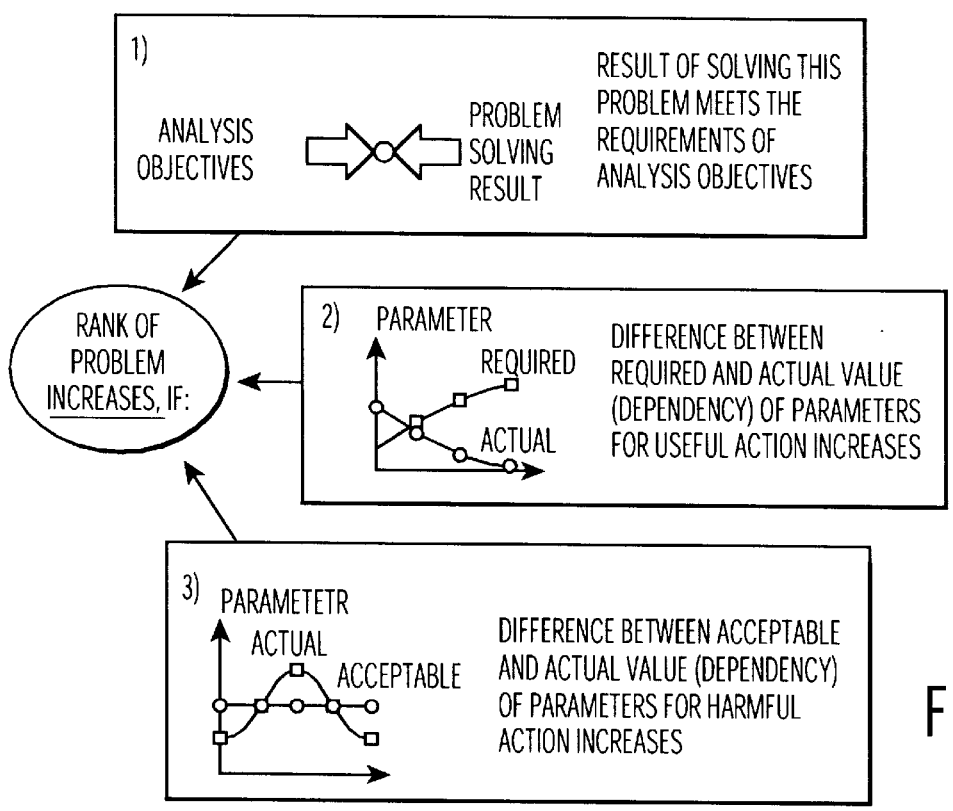

FIG. 46 is a diagram of a Problem rank of component calculation.

DESCRIPTION OF A PREFERRED EMBODIMENT

Figure 1:
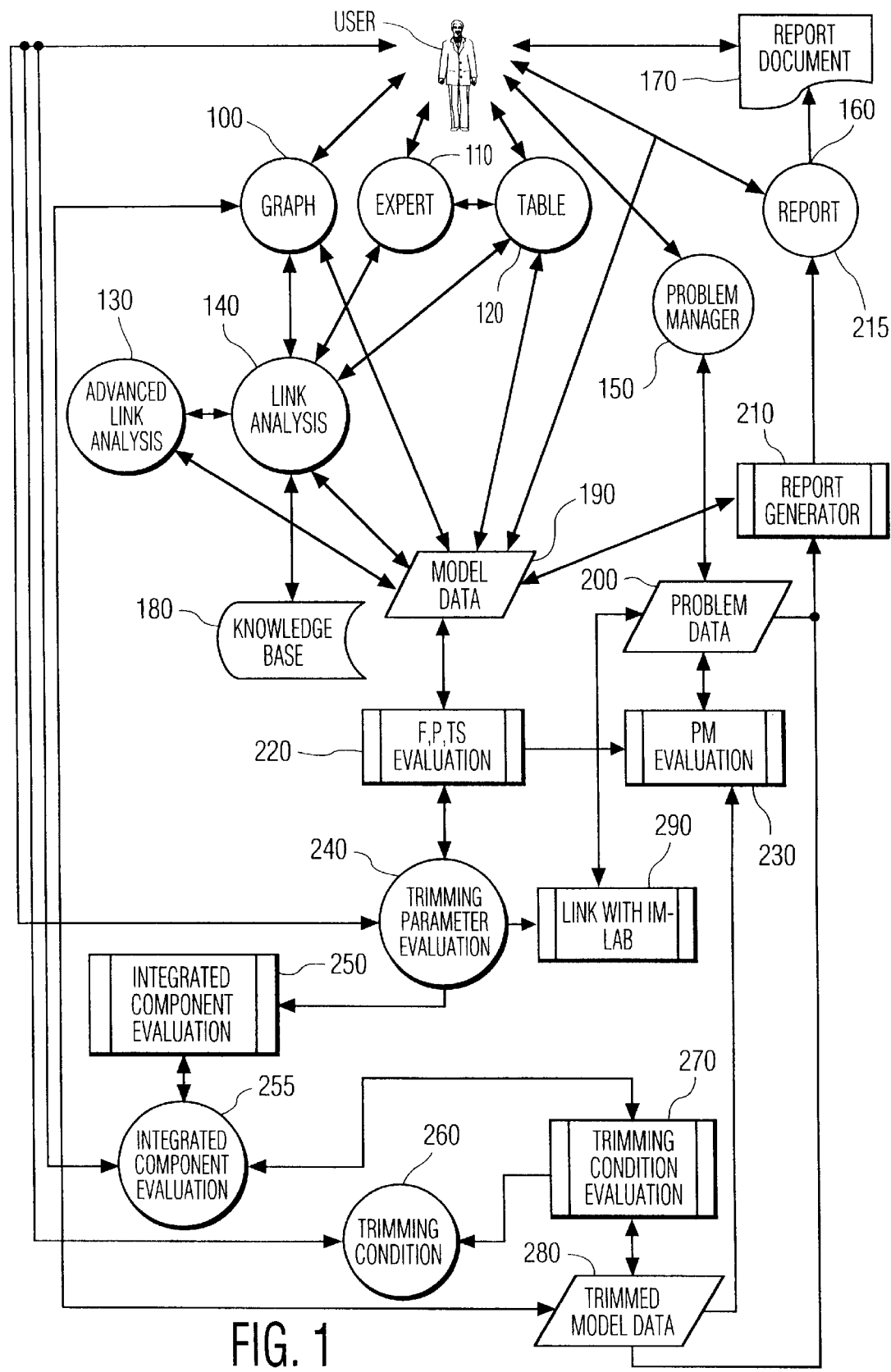
FIG. 1 is a block diagram of one exemplary embodiment of an engineering analysis system (EAS) according to the principles of the present invention.
Figure 2:
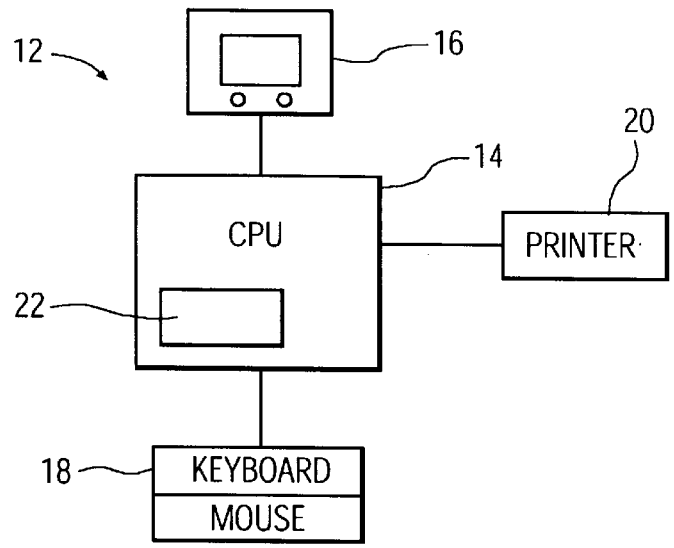
FIG. 2 is a diagrammatic representation of a personal computer which can form a part of the EAS and enable user interaction described below.

With reference to FIGS. 1 and 2, one preferred EAS 10 resides on a personal computer 12 that includes a CPU 14, monitor 16, keyboard, mouse 18, and printer 20. The EAS program may be stored on a portable disk and inserted in disk reader slot 22. Computer 12 can be conventional and be of any suitable make or brand. However, minimum performance specification for computer 12 should be Intel 486 with 20 meg Hard Disk available, 4 meg of RAM, 75 MH clock speed. If paper copy of the EAS session is desired, printer 20 should also be provided. Other peripherals and modem/network interfaces can be provided as desired.

Figure 3:
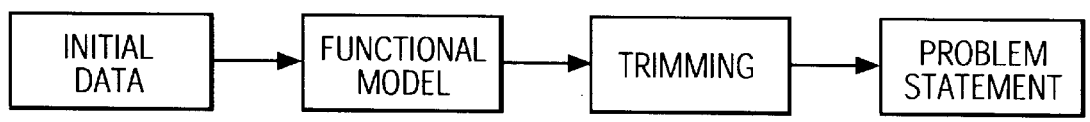
FIG. 3 is a flow diagram of the major sub-sessions or stages of EAS analysis.

With reference to FIG. 1 and the legend in FIG. 3, an EAS session has four main object system analysis stages termed Initial Data, Functional Model, Training and Problem Solving. As the user develops the session, the user can return to and edit or modify any stage data at any time and the EAS will modify the entire project session accordingly.

The user starts a new session by accessing the EAS. The EAS prompts the user to enter the first stage "Project Data." The user can enter initial data with use of the keyboard and/or mouse. During the Project Data stage the user enters initial project data to the report unit 215 and report generator 210. Report unit 215 functions to display elements of the final report on monitor 16 and enable the user to edit various parts of the report. Report generator 210 coordinates the project objectives and rank with model data unit 190 and processes the model data, problem data and trimmed model data into results, as described below, and generates the final report for display by report unit 215.

During the Functional Model stage, the user inputs data to graph unit 100. Unit 100 serves to display a graphic representation of the functional model of the object system under analysis. The user draws a symbol such as a box to represent each component of the object system functional model and a line between boxes to represent each interaction between components. Boxes and lines (links) can be labeled on screen and marked as useful or harmful as determined by the user. Supersystems, products, and their links with specific components are also drawn on screen.

If the user prefers, he/she can call up the expert unit 110 that presents a set of dialog boxes that lead the user through a set of table entries in table unit 120. The model data unit 190 will input data to the graph unit 100 and once the entries to table unit 120 are complete, graph unit 100 will automatically draw the functional model for the user.

Conversely, if the user draws the functional model using graph unit 100 and then accesses table unit 120, the functional model will be represented in table form automatically. The user can edit any data of the functional model in either the graph unit 100 or table unit 120 format.

Model data unit 190 is a data storage facility and obtains and feeds data to the many units generally shown in FIG. 1.

As described below, the user calls up a link analysis unit 140 as part of the Functional Model Stage. This unit 140 enables the user to select for each link in the functional model a short description of the action link, such as compress, move, heat as well as its characteristic such as harmful, insufficient, normal, or excessive. This is done for each link in the functional model and the data stored in model data unit 190.

The user can, for any link, implement an advanced link analysis routine in advanced link analysis unit 130 that enables the user to detail the character of the action by means of comparing actual values of an action with required values of the action. These values are also stored in model data unit 190. This advanced link analysis unit 130 enables four different types of data entry for the actual value and required value of an action parameter. These are Value, Time Dependency, Space Dependency, and Parameter Dependency. As described below, Parameter Value data can be represented either as qualitative relative ratio values or as quantitative values. For example, if the action link is "compress" between two components, the actual PSI and required PSI values can be entered in unit 130. In addition, the actual and desired tolerances can be entered such as ±2 psi and ±1 psi, respectively.

The Time Dependency data is entered to unit 130 by the user selecting the actual and desired parameter values over the desired duration of the action. Space Dependency data is entered to unit 130 by the user selecting the actual and required parameter value at various points in the space or distance through which the action occurs. Lastly, the user enters into unit 130 Parameter Dependency data for the actual and required link parameter as it relates to a separate other parameter in the object system functional model entered (named) by the user.

Although the above four detailed analyses are available, the user need not select them all and can select a "not defined" button which removes that analysis from consideration by the EAS.

All user entered Link Analysis and Advanced Link Analysis data is stored to the model data Unit 190.

Once satisfied, the user initiates the Trimming routine stage.

Trimming is a routine for elimination or simplifying a component or action from an object system while retaining its useful function.

An object system usually includes harmful actions or useful actions which are not optimally fulfilled. Every disadvantage presents a problem that should be solved. Also, distribution of functions among the elements might not be uniform. Some of them might perform insignificant functions and others are overloaded with functions.

The EAS Trimming routine provides analyses for the redistribution of functions and elimination of components from an object system while retaining the components useful functions. Components can be eliminated and their functions transferred to other components or supersystem elements. This process increases the function or decreases the cost of the object system or both, thus increasing the object system value.

The following benefits are provided by trimming:

1. If a component is eliminated, all the harmful actions connecting with this component are also eliminated.

2. Trimming the components lowers the cost of the object system since it is not necessary to produce this component.

3. If a component is not trimmed, but one or more functions are transferred to another component, the first component becomes simpler and less costly.

4. The object structure becomes more optimal and uniform.

Trimming conditions are methods of redistributing the useful functions of an eliminated element. Since it is not practicable to remove a component performing some useful function, the action of this component should be transferred to another element.

A component can be eliminated if:

1) its action is performed by another component or supersystem element;

2) its action is performed by the component which receives the action;

3) the component which receives the action is also eliminated.

If the trimmed component was affected by another component or supersystem element this action must also be transformed.

There are two ways to transform an action applied to a trimmed element:

1) action can be applied to another element;

2) action can be deleted.

To trim an element, the EAS enables the user to:

1) choose an element for trimming;

2) apply trimming conditions;

3) transform the action.

EAS Trimming routine provides two procedures for choosing an element to trim:
use of component evaluation
open choice of component Open choice of component allows the user to choose the component based on the component statistics, analyze the information given by EAS and recommend a decision as to which component should be trimmed. FIGS. 44 A–E shows various EAS rules for elimination and transformation and how the trimmed or transformed component or action would be displayed on the functional model and trimmed functional model.

With use of component evaluation EAS suggests the component for trimming. This is based on its standard evaluations of the problem rank (P), function rank (F), and cost (C), of the components, as entered by the user. EAS then creates a graph to illustrate its calculations. When it plots the components on the graph, EAS places the component with the highest functional rank at the top of the vertical axis. The functional ranks of all the other components are calculated as a percentage of this maximum rank. The procedure is the same for the horizontal axis, which shows the combination of problem rank and cost.

As seen below, the user accesses Trimming: Parameter Evaluation unit 240 and inputs data that ranks the importance of the function (for example, on a scale of 1 to 10) of each functional model component and ranks the problem or harmful effect (for example, on a scale of 1 to 5) associated with each component. The cost of each component in terms of the percentage of the overall cost of the object system under analysis is also entered to unit 240. If more than one project team member was entered during the Initial Data routine stage, then all team members (users) must input to unit 240 their concurrences or agreements to this data. Once a consensus is reached, Function, Problem Rank, Task Significance (TS) Evaluation routine unit 220 accepts this data from unit 240. Unit 220 also receives constantly the Functional Model Data from unit 190. Unit 220 calculates and determines the EAS Functional Rank of each component, its EAS Problem Rank and EAS Task Significance as described below and transmits these values to Integrated Component Evaluation routine unit 250. Unit 250 calculates the EAS functional contribution of each component as a percentage relative to the others and the EAS problem and cost ranking again as a percentage. Lastly, unit 250 determines the ranks of candidacy for trimming (elimination) and represents its recommendation for each component, such as "A" "B" "C" or "D", D being the highest ranking for trimming and A being the lowest candidate rank for trimming. Detailed ranking can be represented in graph form with F on one axis and P+C (problem+cost) on the other. The component trimming candidacy rank can be represented by a dot on the graph located anywhere in or on the line between any of four quadrants A–D as described below.

The Integrated Component Evaluation routine is seen in FIG. 7. Problem rank from unit 220 is entered to unit 430. The user enters the component cost in unit 440 through unit 240. Function rank is calculated in unit 220 as described below and entered to unit 450. Unit 460 receives this data and standardizes the values of F, P and C as a percentage or ratio summing to 100%. The P+C value is then standardized again.

Then EAS unit 250 sorts all components in the object system in accordance with the following table.

| | Level of P + C | |
|---|---|---|
| | Low level of P + G | High level of P + C |
| Level of High level of F | A group | B group |
| F      Low level of F | C group | D group |

The unit 250 then recommends to the user ranked components for trimming first from D group, than from C, B, A. If there are several components inside one quadrant, EAS unit 250 suggest first the component with the smallest relation F/P+C.

This information is represented on screen at unit 255 and enables the user to edit the F, P, TS information as desired.

The information is also provided to Trimming Condition Evaluation routine unit 270. Unit 270 analyzes the action between two components one of which is to be trimmed and suggests another component to which the trimmed function might be transferred. This recommendation can be edited by the user or accepted or represented further as described below.

Function rank of a component is designated as follows:

Every object system interacts with a supersystem or product. The graphic or table representations of the functional model will display one or a chain of components and links or interactions. The component linked to the product or supersystem has the highest rank and the component furthest from the product or supersystem has the lowest rank. If a component performs several useful actions (such as a piston that both compresses and functions as a valve) the function rank will be calculated as the sum of the action ranks. Harmful actions are ignored in calculating function rank.

Figure 4:
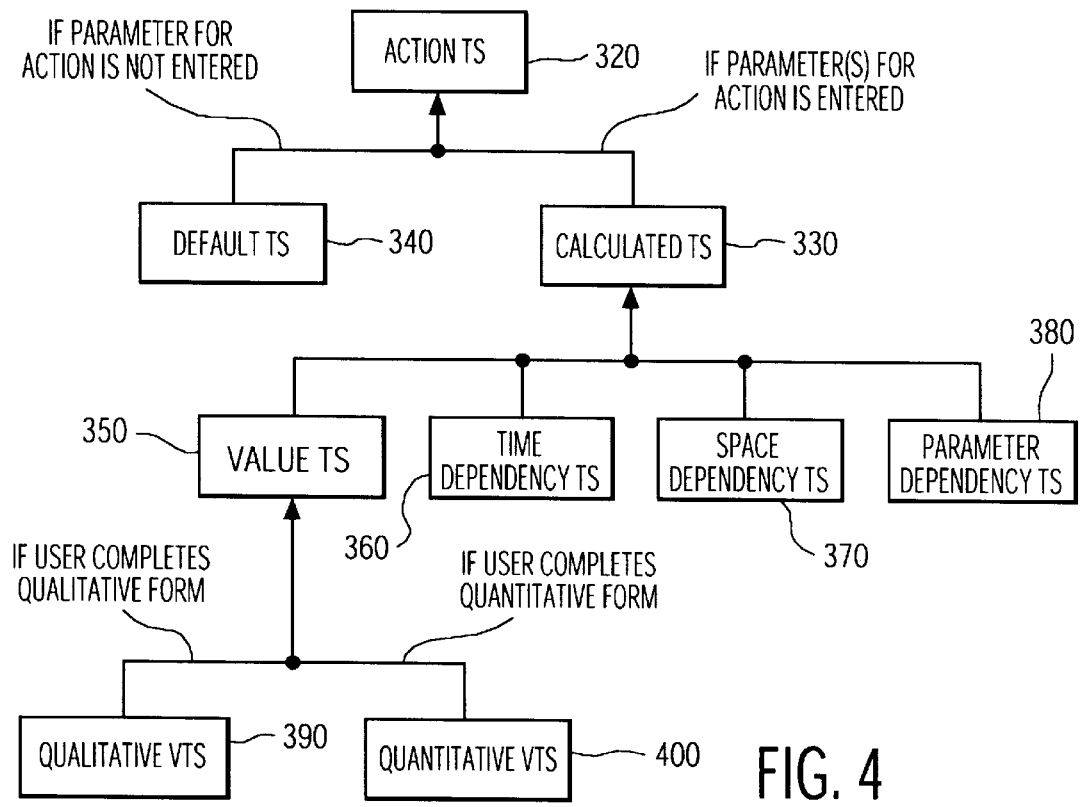
FIG. 4 is a block diagram of the Action Task significance routine.

Task Significance (TS) is automatically calculated in a subroutine of unit 220. The result of this calculation is termed Action Task Significance, see FIG. 4. As seen below, each action can be described by several parameters entered by the user, namely Value TS 350, Time Dependency TS 360, Space Dependency TS 370, and Parameter Dependency 380. When accessing unit 350 the user can select to enter qualitatively through Qualitative VTS (Value TS) unit 390 or quantitatively through Quantitative VTS (Value TS) unit 400. The calculation by unit 350 of Value TS is provided in accordance with the following formula:

$$VTS = k_i \frac{|V_r - V_a|}{IV_r}$$

VTS—value task significance, $k_1$—coefficient of objective importance (If problem is associated with objective, that has high importance, value of coefficients high);

$V_r$—required value of parameter $V_a$—actual value of parameter $IV_r$—admissible deviation of required value.

The calculation by unit 360 of Time Dependency TS, Space Dependency TS and Parameter Dependency TS is provided in accordance with the following formula:

$$DTS = k_i \frac{\sum_{i=1}^{n}(|D_{ri} - D_{ai}|)}{nID_r}$$

DTS—dependency task significance (the formula is similar for all kinds of dependencies);

$k_i$—coefficient of objective importance (If problem is associated with objective, that has high importance as entered by user in Initial Data stage, value of coefficient is high);

$D_{ri}$—value of i-point of required dependency for parameter;

$D_{ai}$—value of i-point of actual dependency for parameter;

$ID_r$—admissible deviation of required dependency;

n—number of point.

The above calculations are for useful actions. For harmful actions, the formulas will be the following:

$$VTS = k_i \frac{|V_{ac} - V_a|}{IV_{ac}}$$

VTS—value task significance, $k_1$—coefficient of objective importance (If problem is associated with objective, that has high importance, value of coefficient is high);

$V_{ac}$—acceptable value of parameter $V_a$—actual value of parameter $IV_{ac}$—admissible deviation of acceptable value.

$$DTS = k_i \frac{\sum_{i=0}^{n}(|D_{aci} - D_{ai}|)}{nID_{ac}}$$

DTS—dependency task significance (the formula is similar for all kinds of dependencies);

$k_i$—coefficient of objective importance (If problem is associated with objective, that has high importance as entered by user in Initial Data stage, value of coefficient is high);

$D_{aci}$—value of i-point of required dependency for parameter;

$D_{ai}$—value of i-point of actual dependency for parameter;

$ID_{ac}$—admissible deviation of required dependency;

i=0 . . . n—current point of dependency;

n—number of point.

Unit 220 also includes a subroutine for calculating the action Problem Rank (P), see FIG. 5. Problem rank is calculated in accordance with the following formula:

$$P = \sum_{i=1}^{n} TS_u + \sum_{i=1}^{m} TS_h$$

P—problem rank;

$TS_u$—task significance for useful action;

$TS_h$—task significance of harmful action;

n—number of useful actions performed by component;

i=0 . . . n;

m—number of harmful actions performed by component;

i=0 . . . M

The original user-entered Functional Model Data is also entered to Trimmed Model Data Storage unit 280. This Trimmed Model data is modified by or edited by the results data of unit 270. Unit 280 applies trimmed model data to Report Generator 210 that generates Trimming Results data and applies it to Report Unit 160 that presents it on screen to the user. Since unit 210 receives and processes both the Model Data from unit 190 and the Trimmed Model Data from unit 280, the Trimming Result report shows a variety of characteristics of the session object system before trimming and after trimming and a percentage improvement of each characteristic after trimming.

These characteristics can include, for example, the number of components in the session object system, number of harmful actions, total component costs, number of links, number of useful actions, and useful action components.

The EAS anticipates that certain technical problems will need solution in order to trim one or more components from the session object. The EAS automatically formulates and accumulates the problems that should be solved. The number of problems can be rather large. So the EAS calculates their significance and sorts them accordingly. To accomplish this, the Problem Manager routine unit 150 enables the user to input data related to the functional model and the action or components desired to be trimmed. The Problem Manager unit 150 prompts the user to enter a full and short description of the problem and select the problem type such as deviate negative effect or increase useful effect. Further, the user enters the significance, if the component can be trimmed, and the group or type of benefit objective of trimming, such as simplify, efficiency, or quality increase. Each component and action of the functional model is assigned an identifying number by unit 150. Problem Manager data is stored in Problem Data unit 200 and processed by Problem Management (PM) Evaluation unit 230 that receives trimmed model data from unit 280 and task significance data from unit 220.

The Problem Manager routine also aids the user in evaluating different designs of the same component to optimize the design of that component in the object system functional model. For this purpose, unit 150 and unit 230 include a Feature Transfer: Object Data prompt that enables the user to enter the quantitative parameters of two or three different models of the same component (such as the actual and two additional known piston designs) as well as the technical and theoretical limits of each parameter. Unit 230 processes the trimmed model data, F, P, TS data, and problem data and calculates an index or quantitative ranking number for each design model and recommends one of the component design models for analysis and improvement and lists the characteristics to be improved. Unit 230 also generates a Feature Transfer: Recommendation on how to begin the problem solution. For example, a piston leakage parameter is to be improved and a piston with better leakage characteristic had been analyzed, the unit 230 recommends to the user to define the technical effect that enabled the leakage resistance to be improved in the alternate piston. If the user needs help in considering a number of technical effects associated with pistons, the user can select a box that will represent on screen a number of technical effects related to pistons and select the one that contributed to the better parameter achievement by the alternate piston. The unit 150 then formulates the technical problem statement for the user, as described below. This technical problem statement is presented to the user through unit 150 and it and all problem data is entered in Report Generator unit 210. Problem data is also conveyed to a problem solving model interface 290. The technical problem solving module can be the above mentioned Invention Machine Software.

With reference to FIGS. 1, 6 and 7, Problem Manager routine unit 230 can process two types of problems:

1—problems related to actions between elements (action problem)

2—problems associated with trimming procedure (trimming problem)

Action problems are processed in unit 230 using the Action TS data from unit 220 as described above. Trimming problems are identified or connected with a trimmed component. If the component is trimmed the problem connected with that component should not be solved. The following rules apply to component trimming in unit 270:

Component can be eliminated if:

1. its action is performed by another component or supersystem element;

2. its action is performed by the component which receives the action;

3. the component which receives the action is also eliminated.

If the trimmed component was affected by another component or supersystem element this action also must be transformed. There are two ways to transform an action applied to a trimmed element:

1. action can be applied to (transferred) another element;

2. action can be deleted.

The user chooses one of the trimming conditions through unit 150.

If the Action can be transferred, then the subroutine of FIG. 6 is run in unit 230. Here unit 230 calculates the sum of the problems of I group associated with the component (box 420) and generates a new problem of action transfer with significance equal to this sum (box 430).

Figure 8:
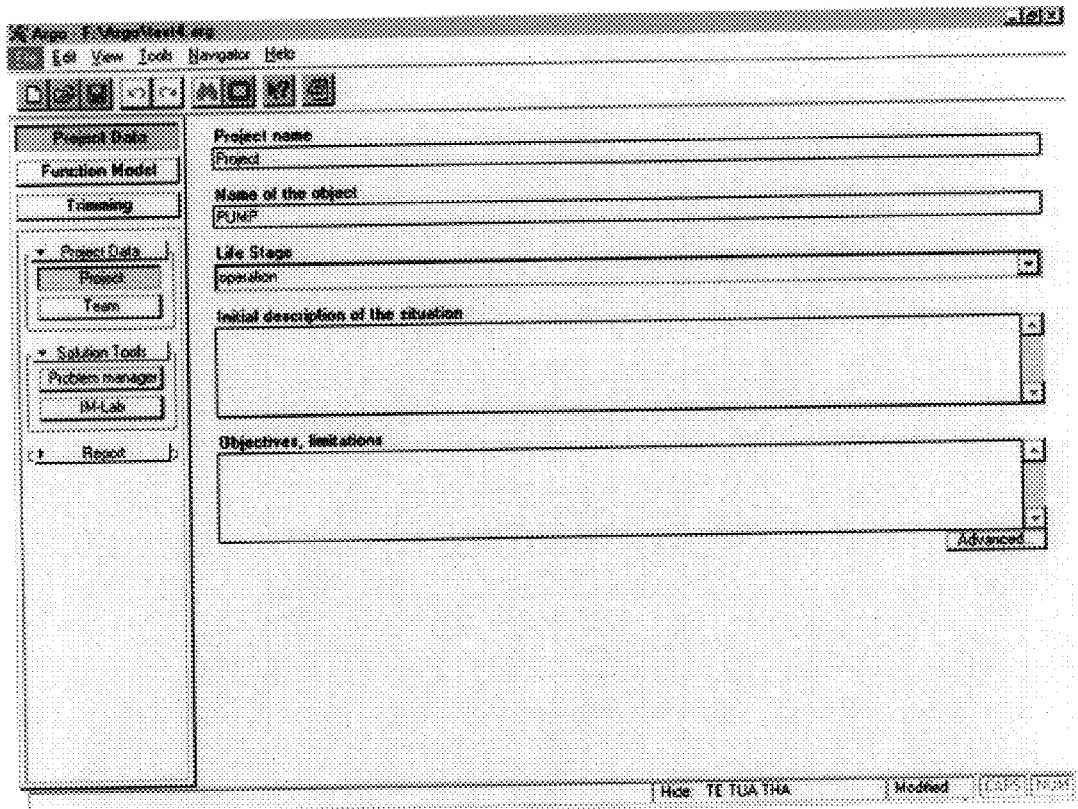
FIG. 8 is a visual display device screen illustrating a display for inputting data and displaying initial project data.

The detailed process steps for a typical EAS session will now be described using a water pump as an example of an object system. As stated above and with reference to FIG. 8, a session begins with EAS prompting the user to enter certain basic information into a Project Data File, such as Project Name; Name of engineering system for re-design, such as "PUMP" in this example; Life Stage of the Pump, selected from a menu such as developmental, operational, or maintenance; Initial Situation Description, such as "Pump has low value because of high maintenance from frequent clogging and corrosion;" and Objectives, Limitations, such as "reduce clogging and corrosion without significant increase in pump cost."

Figure 9:
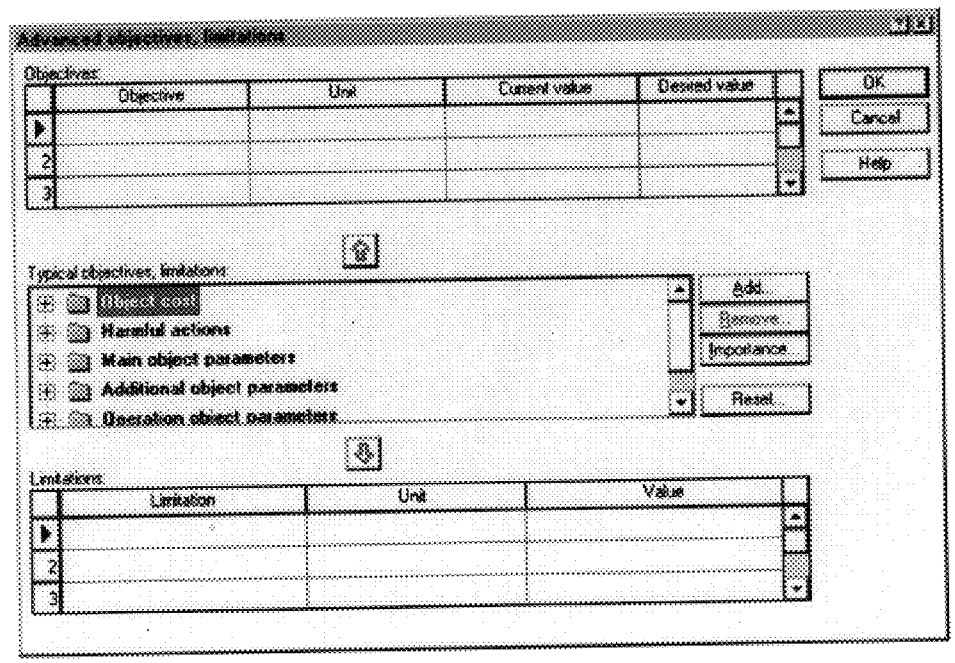
FIG. 9 is a visual display device screen illustrating a display for inputting data and displaying advanced project data.
Figures 10, 11:
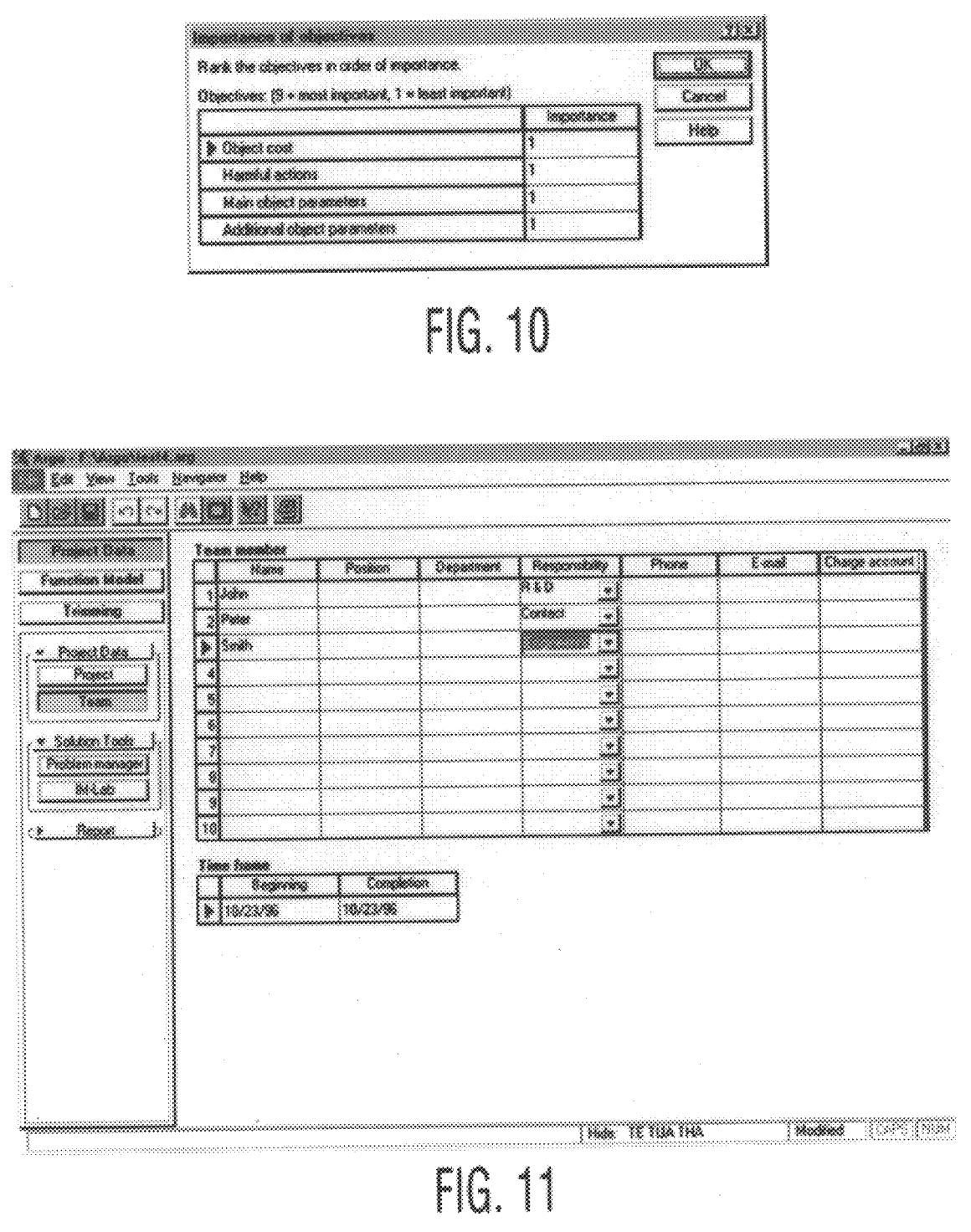

If Advanced button is selected, FIGS. 9 and 10, the EAS will prompt the user to optionally enter detailed objectives such as the unit of measurement, the current value, the desired value, and whether the value should increase or decrease as a session objective. This Project Data field provides a list of possible objectives and limitations. The user may select the items from this list which apply to the current project. This list may also be customized by the user using add and remove buttons. Each of the categories for the objectives and limitations should be ranked according to their importance. EAS will use this ranking later when it calculates which problems are most urgent and which components can be trimmed.

If team members are to work on the project, they can be listed in the team file, FIG. 11, and a final report can only be generated with the computer concurrence of all these members.

The first step in using EAS to analyze an object system is to draw an object structure. The components (parts of the object) will be shown on screen. Each object system has a hierarchy and is decomposed into units; the units are decomposed into parts and so on. It is preferred to start the analysis on the highest level of the hierarchy. If necessary, EAS can analyze the lower levels of the hierarchy simply by breaking components into sub-components. The interaction of the object with the elements of the environment, products and supersystem elements, should also be shown.

Accordingly, the EAS prompts the user to open a second file called Functional Model in which the user can input data and the EAS will display the object system functional model. The user can select a Graph mode FIG. 12 or Expert step-by-step mode. In the graph mode, the user defines (draws boxes and labels them) every subassembly or component in the object system, such as the cylinder, piston, valve and lever of the pump. The pump product "water" 14 is also identified along with the supersystem "Air" 10 and "Dust" (meaning dirt) 12.

Once all such elements are represented, the user enters all useful interactions between elements such as "compress" between piston image and water image and "direct" between the cylinder and piston images and "move" between the lever and piston images. Also, the EAS enable the user to represent harmful effects of element interaction such as "clogging" between the dust and valve images and "corrode" between the supersystem air image and the cylinder image. The interactions can be represented in different colors such as blue or black for useful and red for harmful.

Figures 27, 28:
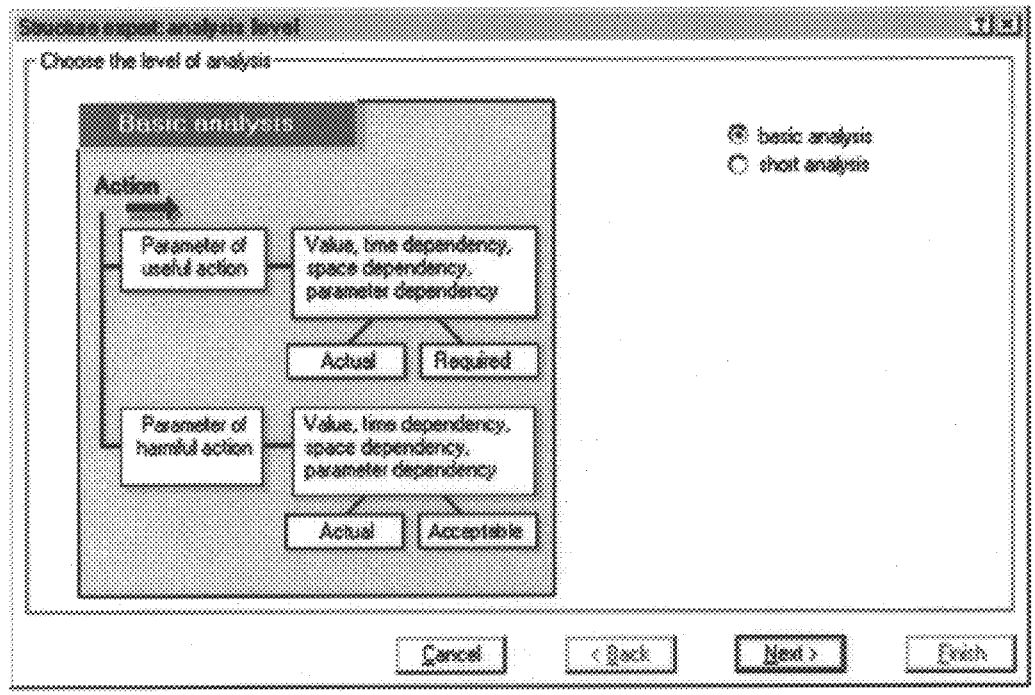
FIG. 27 is a visual display device screen illustrating a display for inputting data and displaying the expert mode analysis level.
FIG. 28 is a visual display device screen illustrating a display for inputting data and displaying the expert mode product element definition.
Figure 29:
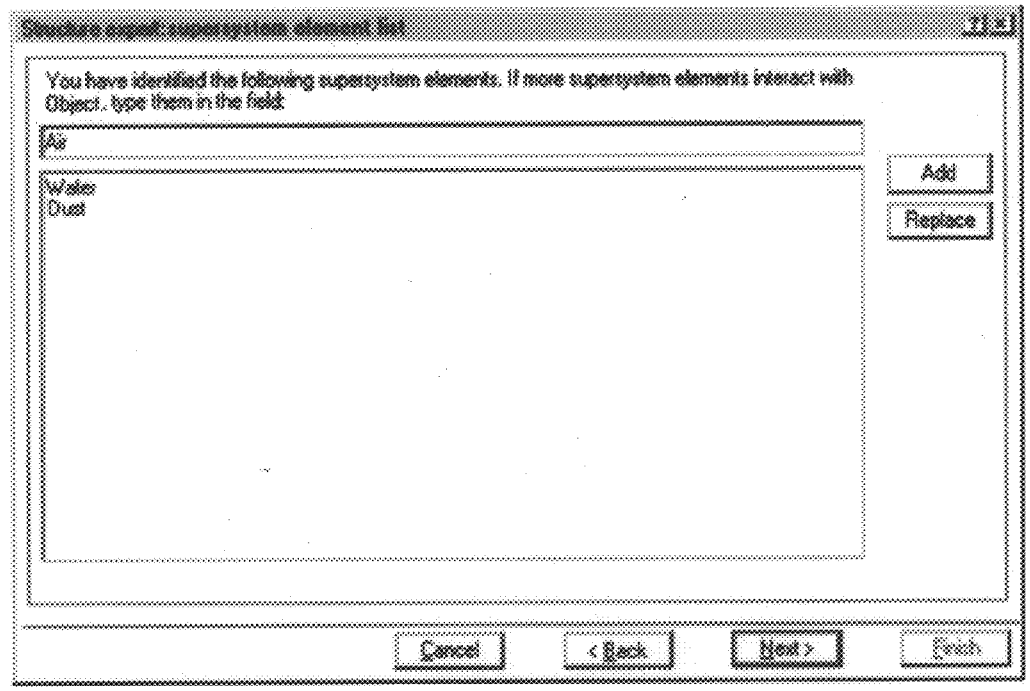
FIG. 29 is a visual display device screen illustrating a display for inputting data and displaying the expert mode supersystem element list.
Figure 30:
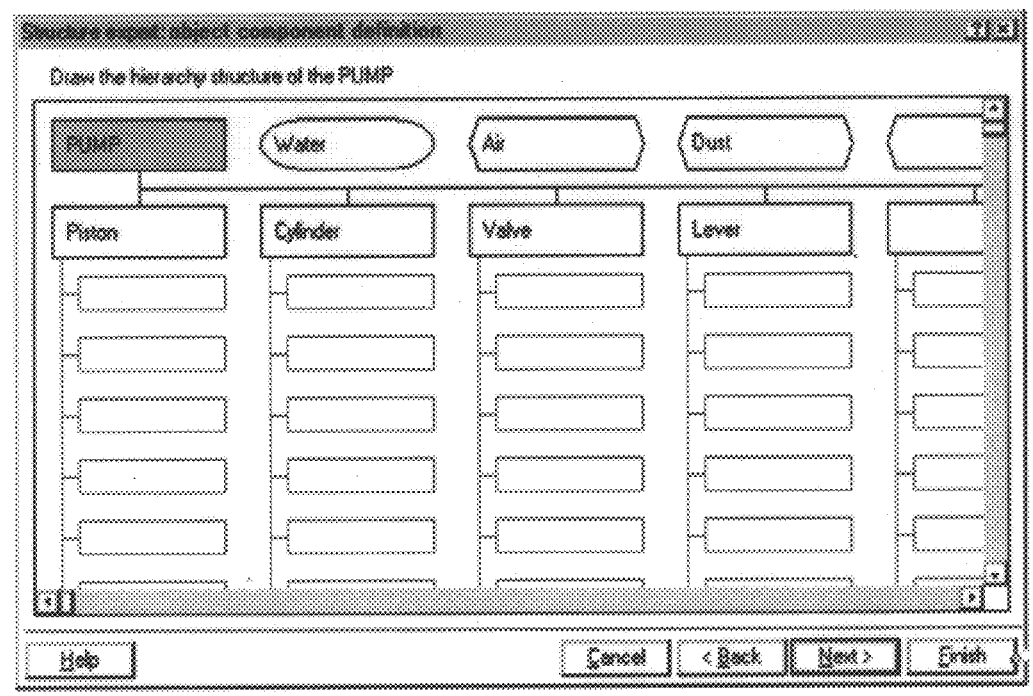
FIG. 30 is a visual display device screen illustrating a display for inputting data and displaying the expert mode object component definition.

If the user is a beginner in analysis or if the user likes a step-by-step analysis, then the user can select the Expert mode and the EAS units 110 and 120 will initiate a routine to provide a series of dialog boxes in table form that leads the user through the data entry steps described above. This routine enables an alternate method of inputting the functional model data as described above. The first dialog box displayed for Expert is shown in FIG. 27 in which the user can select a "basic" or detailed and advanced analysis or a "short" or less detailed analysis. If the short analysis, no information about harmful actions will be permitted by the EAS, but parameters, values and dependencies can be entered for useful actions. Once the analysis mode is selected a dialog box, FIG. 27 enables the user to enter the supersystem product or media with which the object system produces or interacts. In the example below the object system (pump) interacts with the product "water" so water would be entered. Next the Expert routine displays a dialog box, FIG. 28 calling for entry of additional supersystem elements, such as air, dirt, or other environmental elements which interact with the object system. Each element is added to the dialog box by the user. Next, the Expert routine displays a dialog box showing boxes arranged in a hierarchy, see FIG. 29. The names of the object system and product and call other supersystems automatically appear in the top row of boxes. The user enters each major component in the next row of boxes and, if desired, each sub-component in the boxes below a component. All data in this dialog box can be edited as desired and previous screen data will be changed accordingly.

Figure 31:
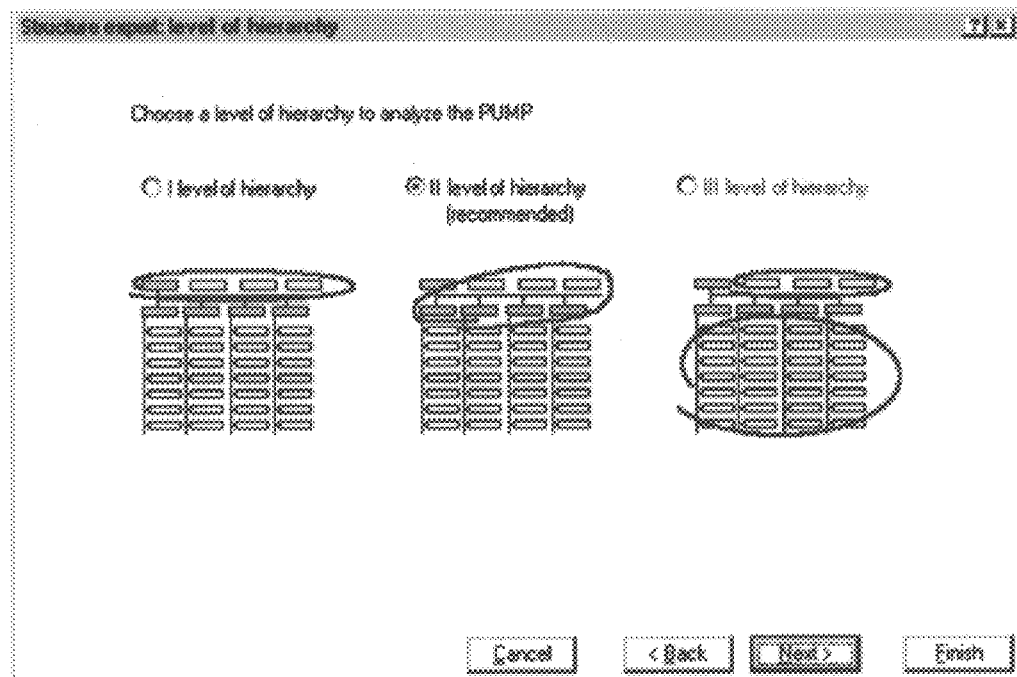
FIG. 31 is a visual display device screen illustrating a display for inputting data and displaying expert mode level of analysis hierarchy.

Next the user chooses a level of hierarchy to be analyzed. The I level simply enables the EAS to analyze the level above the component level. The II level enables a first component level analysis and the III level enables all levels to be analyzed. See FIG. 31.

Figure 32:
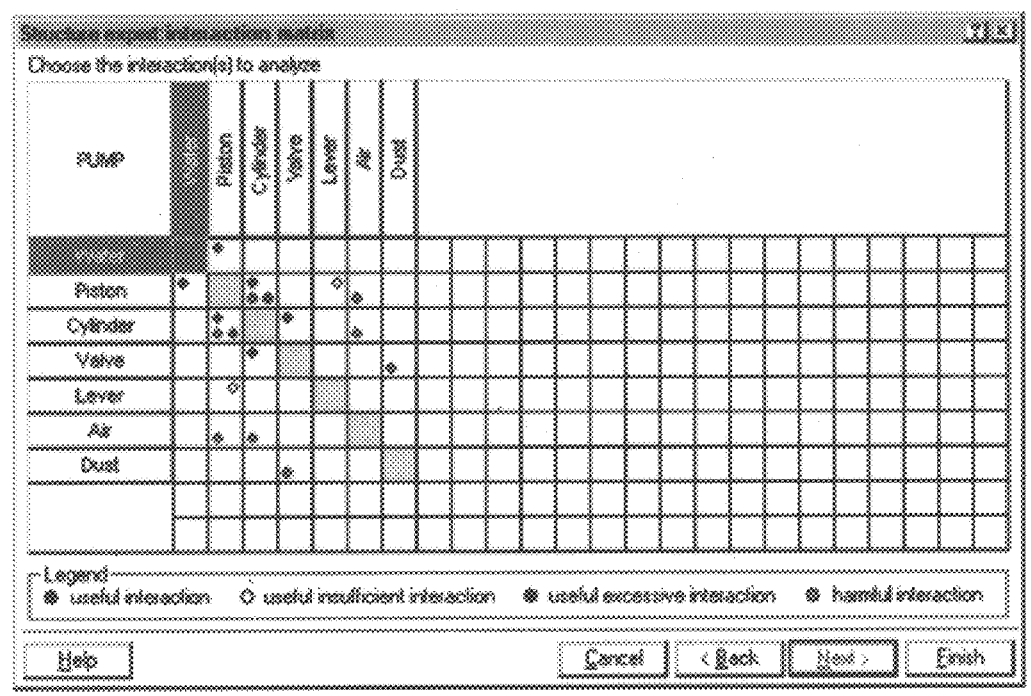
FIG. 32 is a visual display device screen illustrating a display for inputting data and displaying expert mode matrix of interaction.

The Expert routine next displays a legend of interaction among all components, elements and products and displays a legend of four interactions across the lower portion of the matrix. See FIG. 32. Note all components, elements, and products appear along both X and Y axis. The user can click on any intersection, box for X and Y entries, select any ones of the four interactions along the bottom and then click on one of the element names to save the interaction selections. These selected interactions will appear in the respective box intersection as shown in FIG. 32. Interactions can be deleted (edited) from a box by clicking on one of the axis entry names, then clicking on the action to be deleted. All interactions within all boxes can be entered in the same way. Note the four interactions include "useful", "useful insufficient", "useful excessive" and "harmful", each being associated with a different symbol or color, preferably red for harmful.

Figure 12:
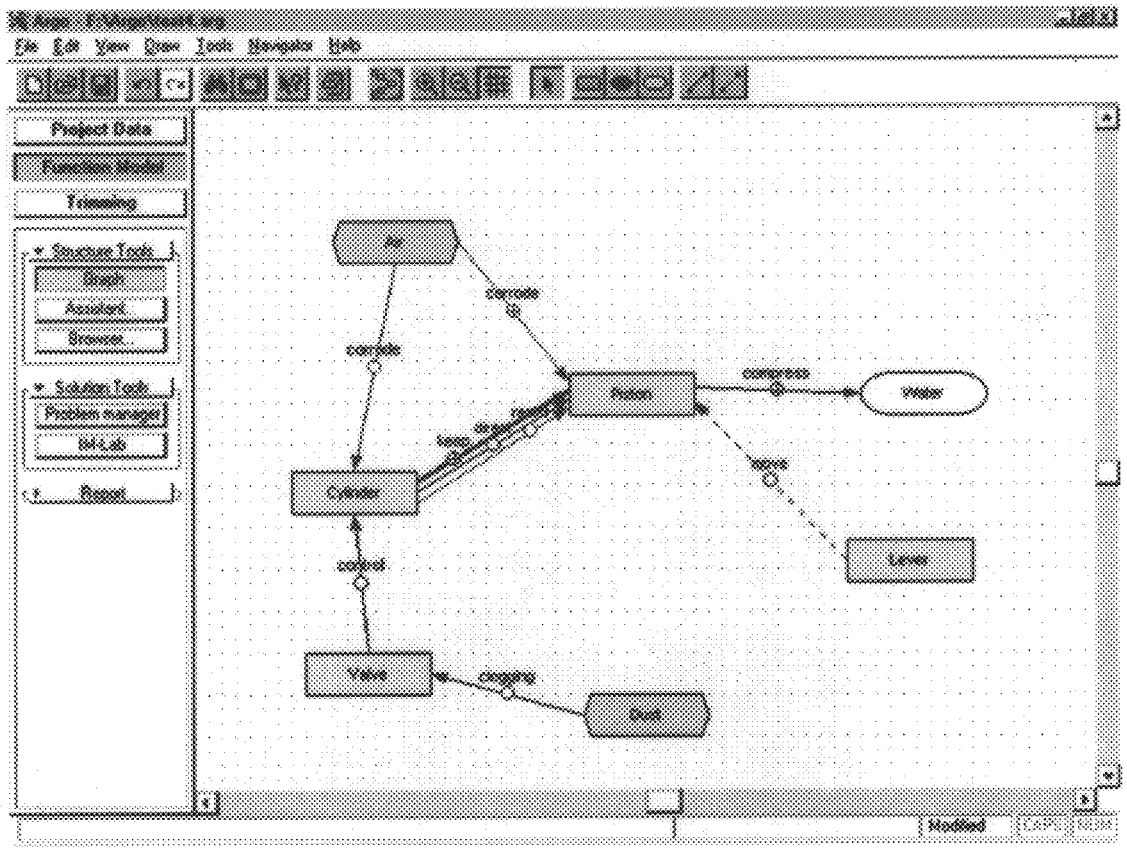
FIG. 12 is a visual display device screen illustrating a display for inputting the data and displaying the graph mode functional model of a water pump as the object system.
Figures 33, 34:
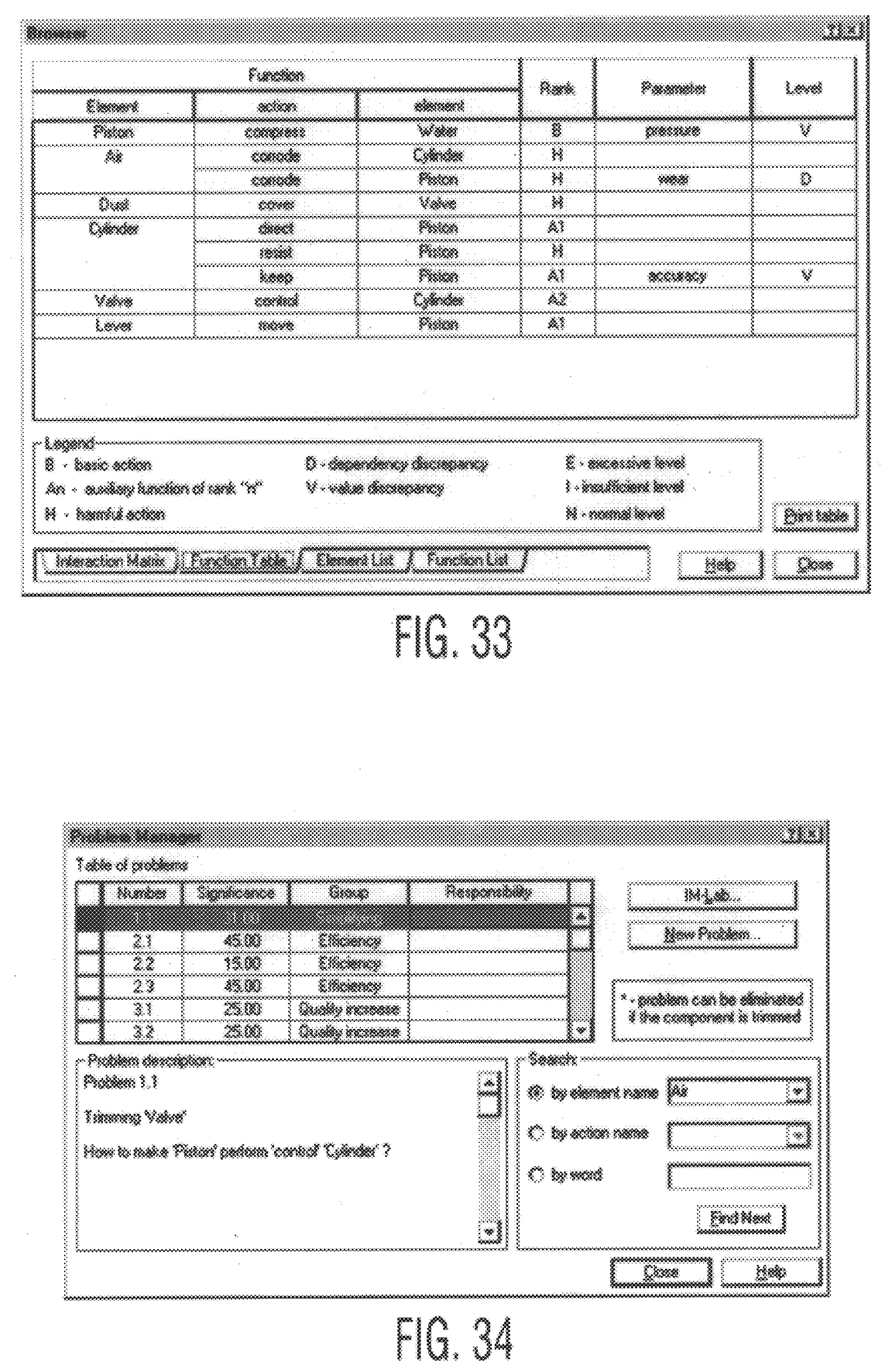

Once the above data is entered, the user can click on Finish to save to Model Data unit 190 and click on Browser that displays the table of FIG. 33. Here the user can enter each action name between each product, component, and/or supersystem and enter the Rank of interactions as harmful (H) or basic (B), auxiliary function rank $A_1, A_2 - - - A_n$, enter the parameter to be analyzed as described below and the value or dependency discrepancy as described below. This data is stored in unit 190 and at this point the functional model can be displayed by the EAS via unit 100, see FIG. 12, and the user is ready to implement the Link Analysis and Advanced Link Analysis described below. After entering the data on tables and the like, the EAS will automatically draw the diagram of the object system as shown in FIG. 12. It will be noted that more than one action can be entered between components, such as the three different actions shown in FIG. 12 between "cylinder" and "piston".

Figure 13:
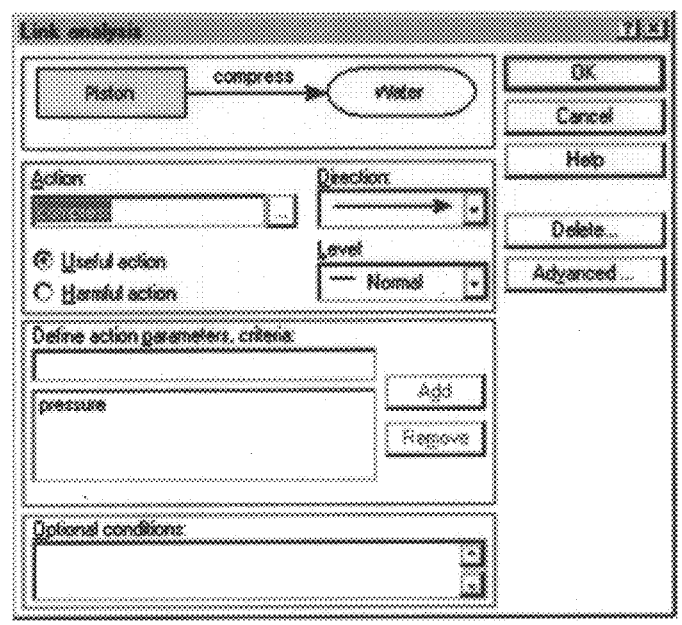
FIG. 13 is a visual display device screen illustrating a display for inputting data and displaying link analysis for the functional model of FIG. 12.

The EAS Functional Model can then prompt the user to perform a Link Analysis followed by an optional Advanced Link Analysis, so that each link or interaction between all elements are examined one at a time. The Link Analysis presents to the user the image of two elements and the selected link or interaction between them. See FIG. 13 that shows the user data input capability for the analysis of the "compress" interaction between piston and water of the present session. The Link Analysis prompts the user to identify the link as harmful or useful, the level rank of the function of the interaction to the overall function of the object system. This Level includes the user choices Excessive, Normal, and Insufficient and represents the first or basic level of link analysis. If more detailed analysis of the link is desired, the user enters the parameter(s) to be entered and selects Advanced. See FIGS. 13 and 14. The Advanced Link Analysis lists each parameter, e.g. "pressure", and prompts the user to initiate data entry for the following EAS analysis:

Quantitative Value
Time Dependency
Space Dependency
Parameter Dependency

Figure 14:
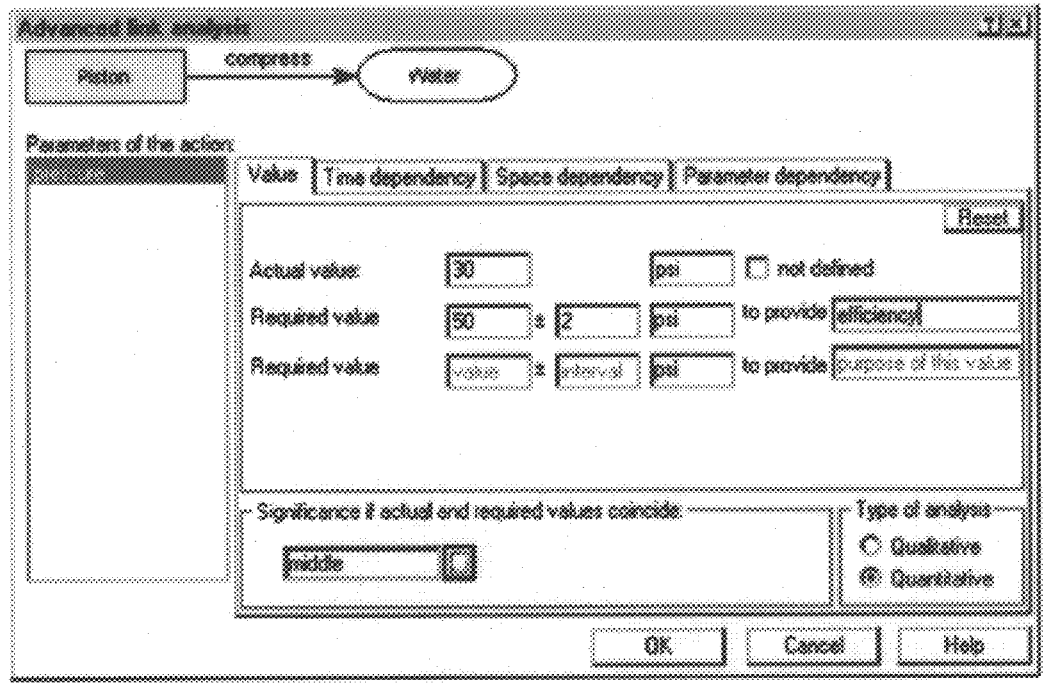
FIG. 14 is a visual display device screen illustrating a display for inputting data and displaying parameter quantitative value link analysis.

In the example session, see FIG. 14, Value screen prompts the user to indicate the qualitative or quantitative nature of the value and input the actual pressure value, the required pressure value plus or minus the tolerance. High, middle, or low significance of this value can also be selected.

Figure 15:
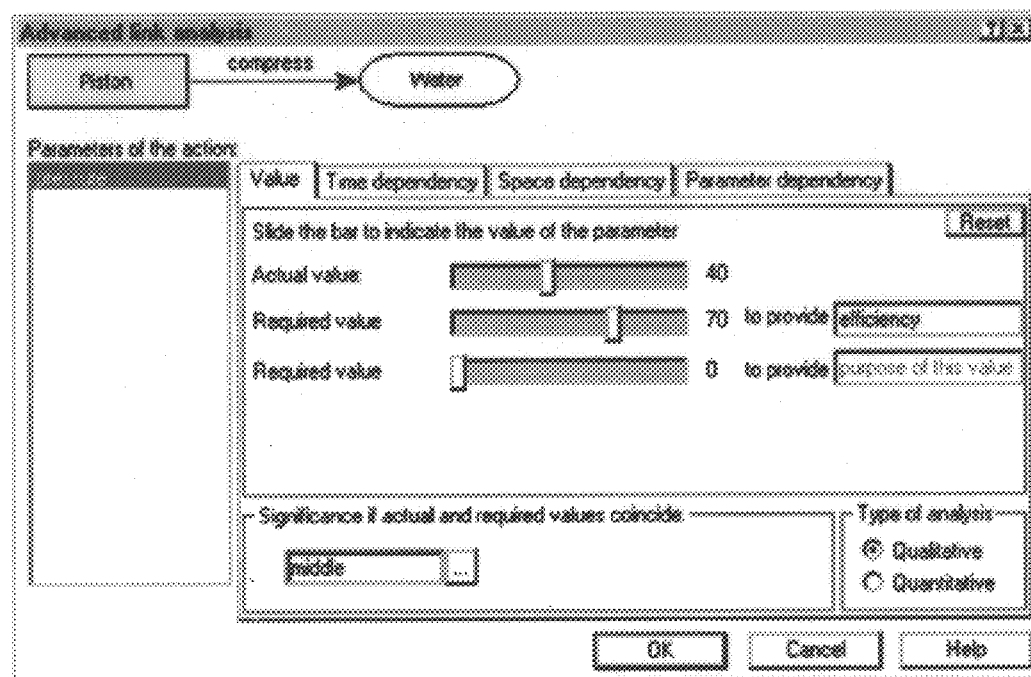
FIG. 15 is a visual display device screen illustrating a display for inputting data and displaying parameter qualitative value link analysis.

Alternatively, if actual numbers are not known, the qualitative value can be selected and the user indicate actual and required pressure value by a relative slide button adjustment, see FIG. 15.

Figure 16:
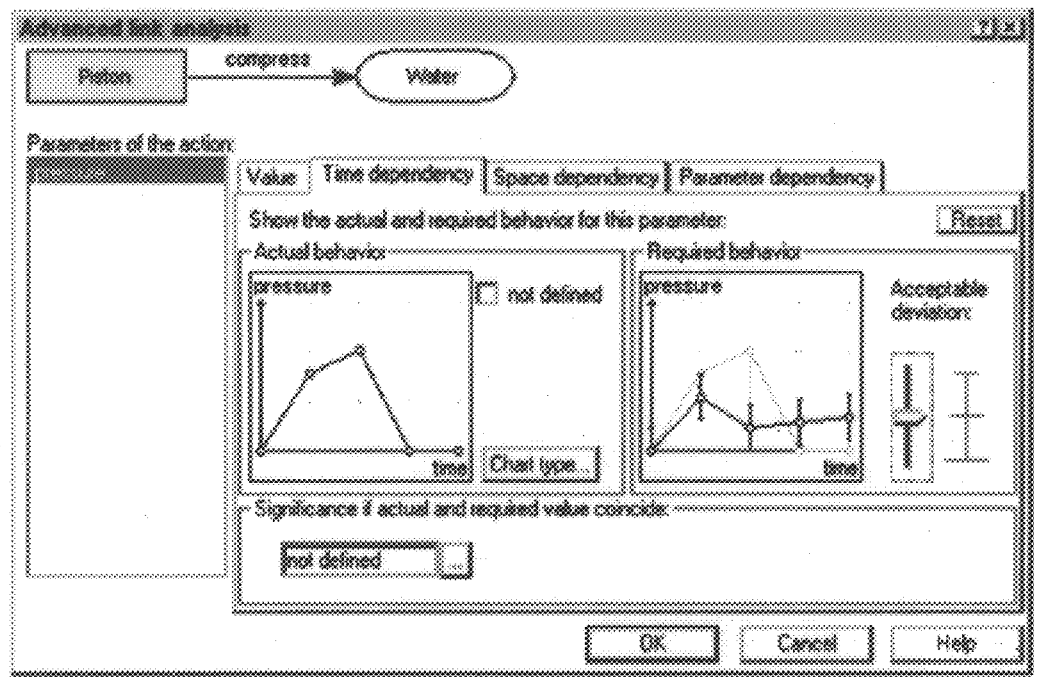
FIG. 16 is a visual display device screen illustrating a display for inputting data and displaying time dependency link analysis.
Figure 17:
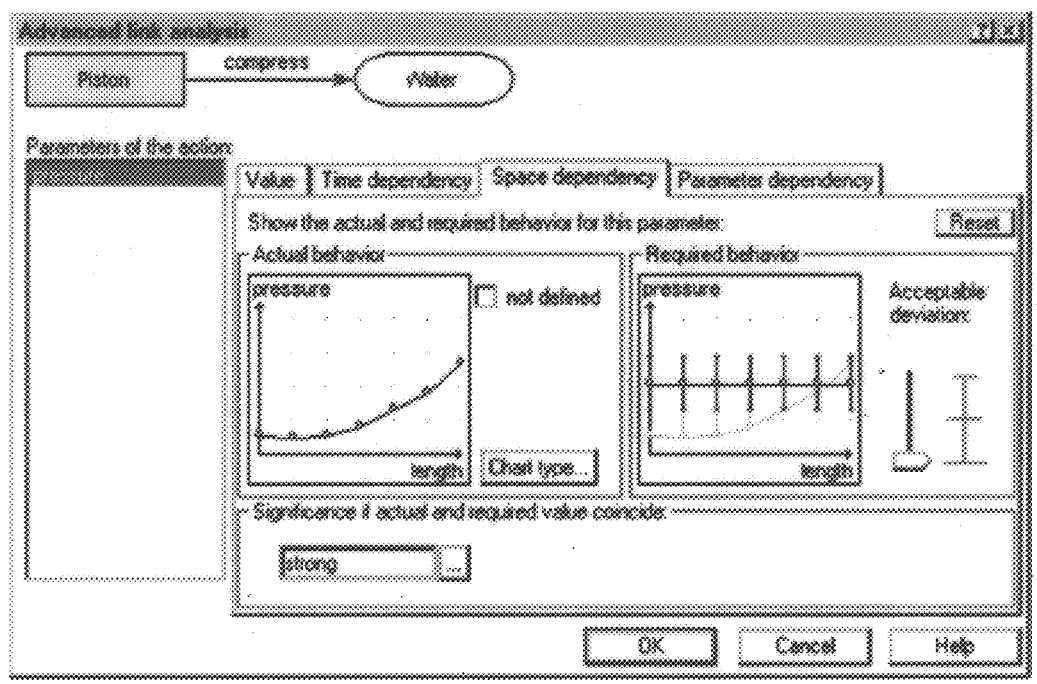
FIG. 17 is a visual display device screen illustrating a display for inputting data and displaying space dependency link analysis.
Figure 18:
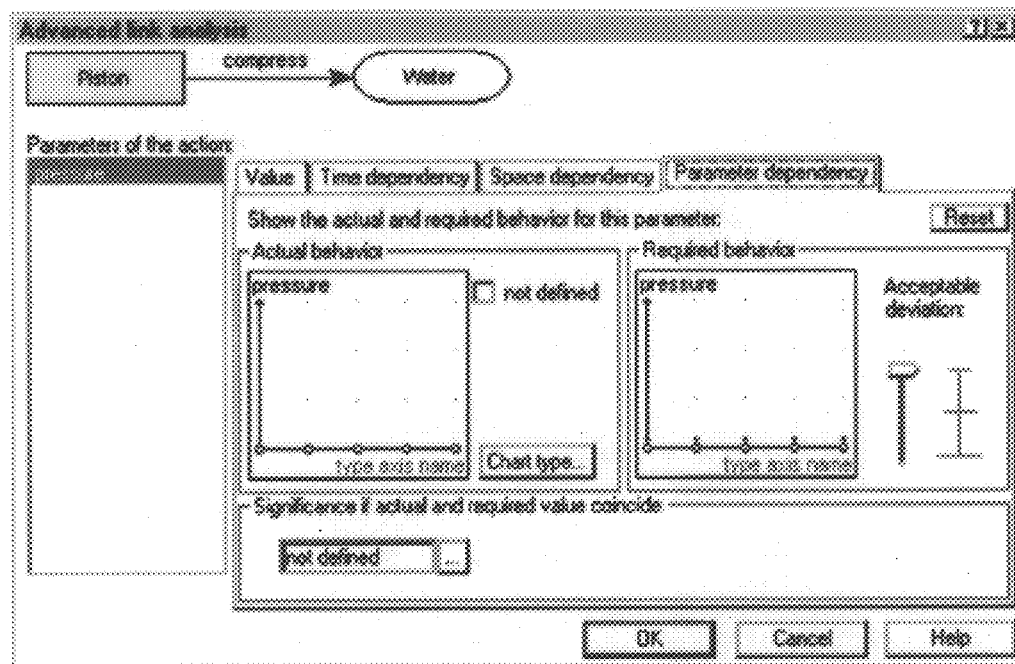
FIG. 18 is a visual display device screen illustrating a display for inputting data and displaying Parameter dependency.

Further analysis and data input is achieved for time, space and parameter dependency, see FIGS. 16, 17, and 18. In each of these screens, two graphs are presented both with "pressure" forming the X axis and a user named axis as the Y axis. The left graph is the actual behavior of the link parameter and the right graph is the Required Behavior. An Acceptable Deviation slide button allows the user to set this factor for the required Required Behavior chart. The user enters data by placing the cursor on each graph circle on the Y axis and raising it to the desired level on the X axis. As seen in FIG. 17, the pressure actually rises with, for example, respect to the cylinder length whereas the user requires a constant pressure over the cylinder distance. In FIG. 16, a different pressure duration of stroke characteristic is desired with a set deviation than actually present in the object system.

Figure 19:
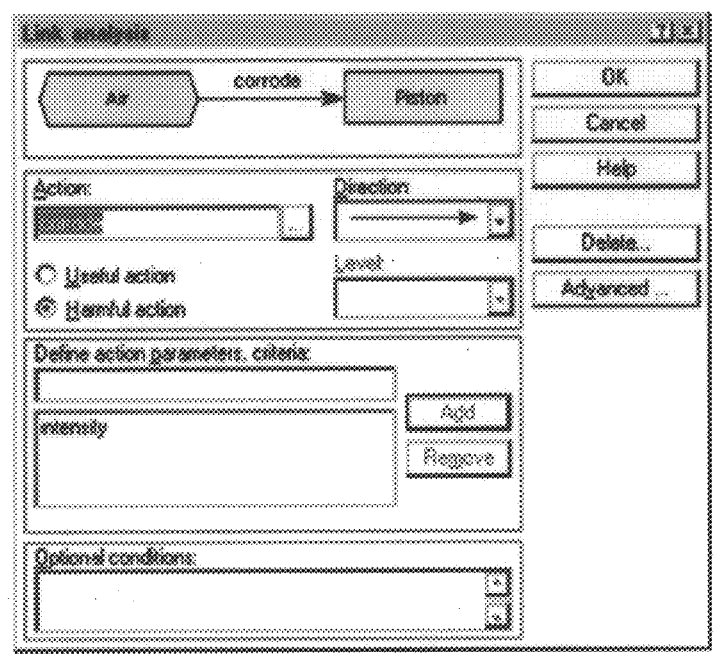
FIG. 19 is a visual display device screen illustrating a display for inputting data and displaying data similar to FIG. 13 but for a different, harmful action analysis.

In each of these cases, there may be a parameter that has no fixed value and the value depends on the circumstances. In this case, the user would select "not defined" such as seen in FIG. 18 for Parameter Dependency. When the user completes each step of the Link and Advanced Link Analysis, the "ok" button is selected. Regardless of the type of data entered, the data is stored, but can be edited at any time as described above in relation to FIG. 1 description. The above Link Analysis can be done and screens are provided for each link or interaction between components. For example, FIG. 19 shows the Link Analysis for "corrode" between the supersystem "Air" and the "Piston." Note that the "Harmful" button has been selected. The Value, Time, Space and Parameter dependencies analyses screens (not shown) are the same as for FIGS. 14–18 enabling the user to enter data for a harmful action.

Figure 20:
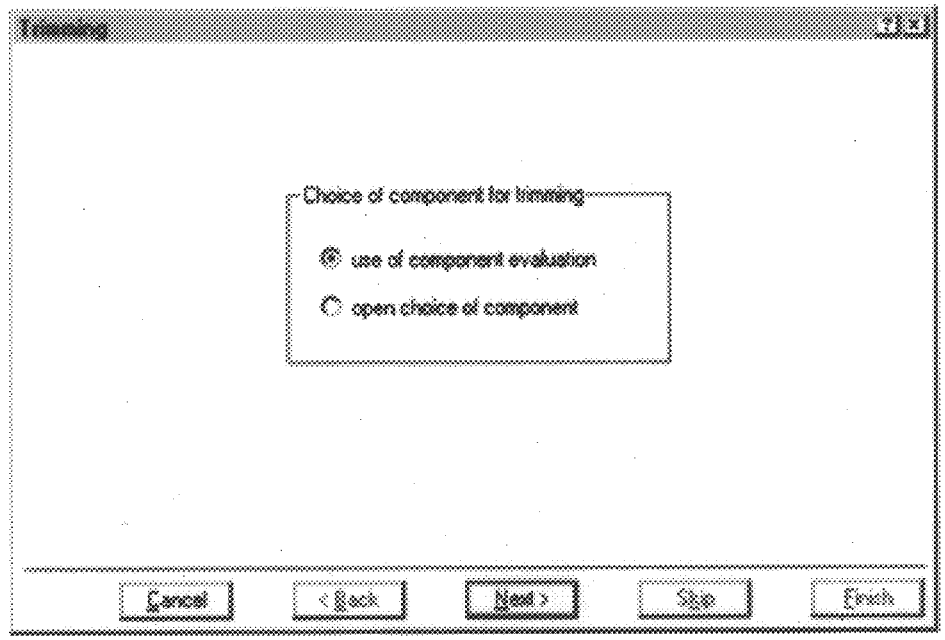
FIG. 20 is a visual display device screen illustrating a display for inputting data and displaying the user choice of component trimming.

The EAS enters the Trimming Stage, FIG. 3, by presenting the screen of FIG. 20 in which the user can select to have the EAS recommend the component or components to be trimmed using cost, problems, and functional evaluations of the components from unit 220 or "open choice" meaning the user will decide which components to recommend to trim.

Figure 21:
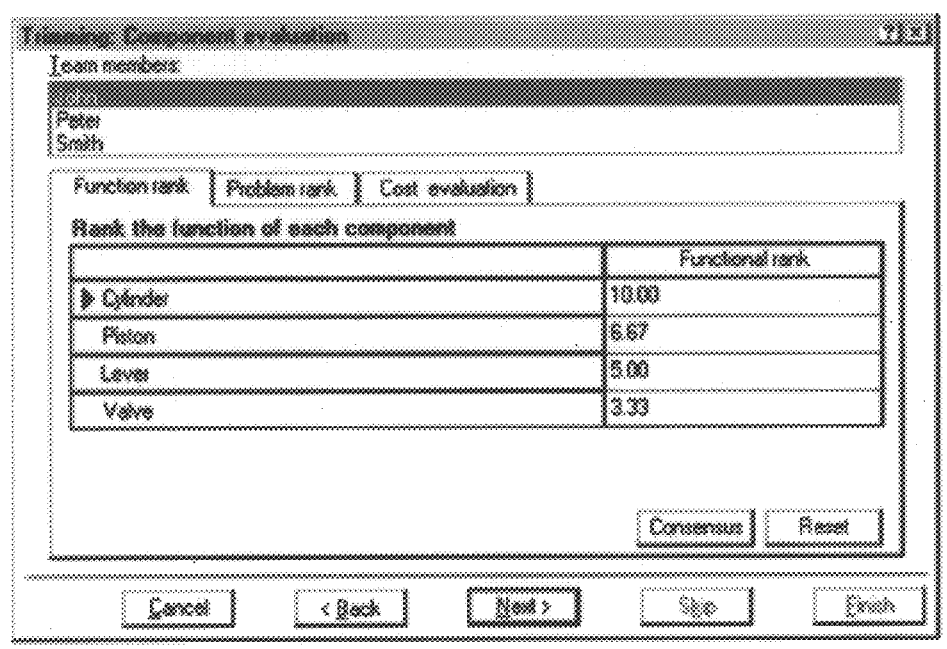
FIG. 21 is a visual display device screen illustrating a display for inputting data and displaying trimming parameter evaluation functional rank.
Figures 22, 23:
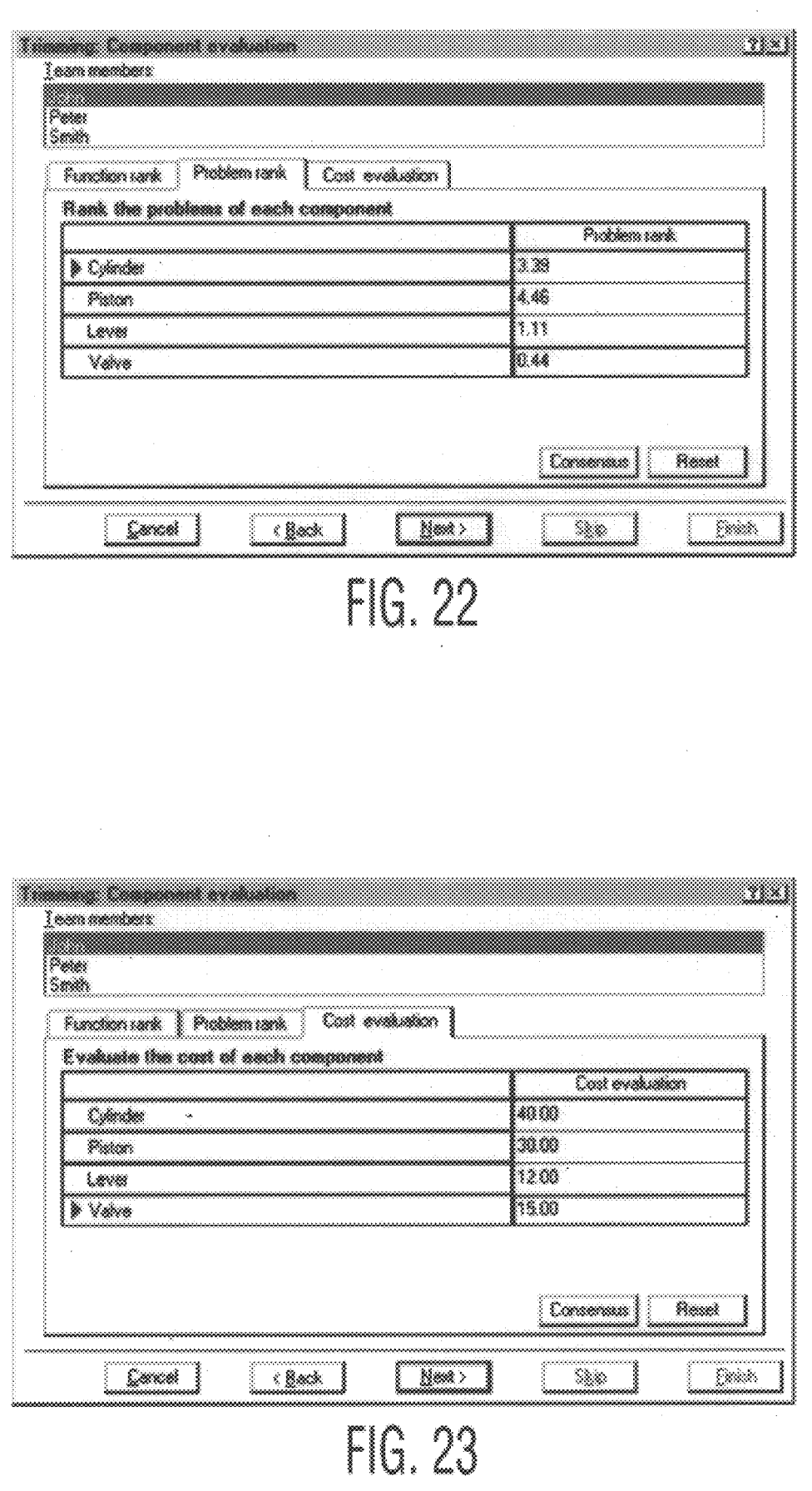

If the EAS Trimming recommendation is selected, the Trimming:Parameter Evaluation screen, FIG. 21, displays through unit 240 the Problem Rank for each component of the object system. Team members are also listed and when each member reviews and concurs with the data displayed the user selects the consensus button. Next the Problem Rank is displayed for each component, FIG. 22 and unit 220, FIG. 5 and the calculation of Problem Rank above, and again the consensus selected. Lastly the Cost Evaluation is displayed, FIG. 23, for each component as a percentage of the entire cost of the object system, and again the consensus indicated. It should be understood that the data displayed in FIGS. 21, 22, 23 can be edited and all previous EAS calculations will be changed accordingly. This editing capability will contribute to the team consensus being reached.

Figure 24:
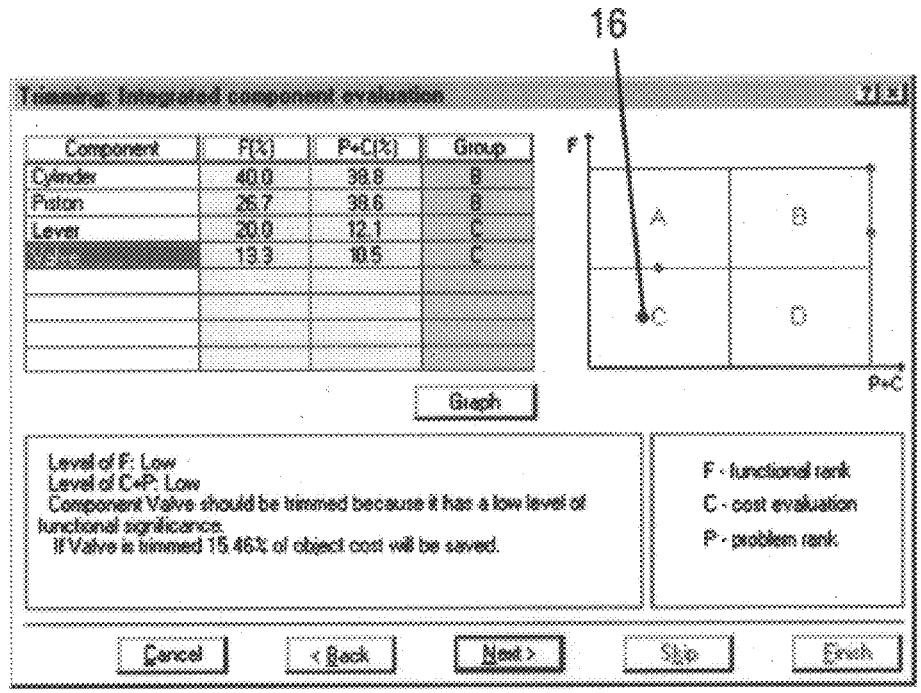
FIG. 24 is a visual display device screen illustrating a display for inputting data and displaying trimming integrated component evaluation.

Next, the EAS displays the Integrated Component Evaluation Table and/or graph of FIG. 24 where each component has its Function and Problem+Cost rated as a percentage relative to the other components, as described above, then EAS assigns an A–D ranking or dot location on a 4-quadrant graph as shown. Each component can be highlighted for highlighting its dot on the graph while other dots for other components remain light. This display is associated with unit 255 of FIG. 1. As seen in FIG. 24 the valve has the lowest ranking and lowest position 16 in the lowest quadrant "C" and is the best candidate for Trimming. No components fall in the "D" quadrant.

Figure 25:
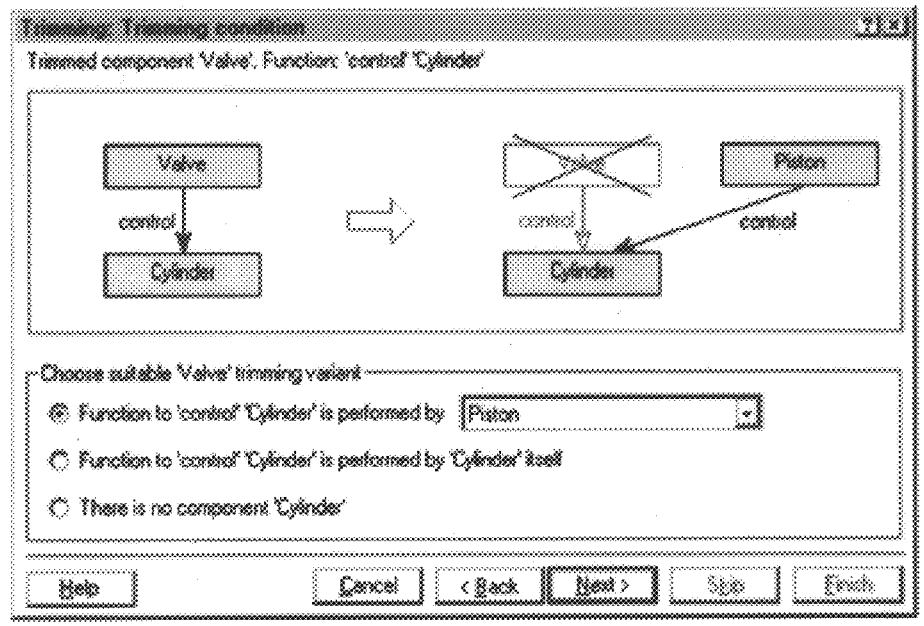
FIG. 25 is a visual display device screen illustrating a display for inputting data and displaying trimming condition.
Figure 26:
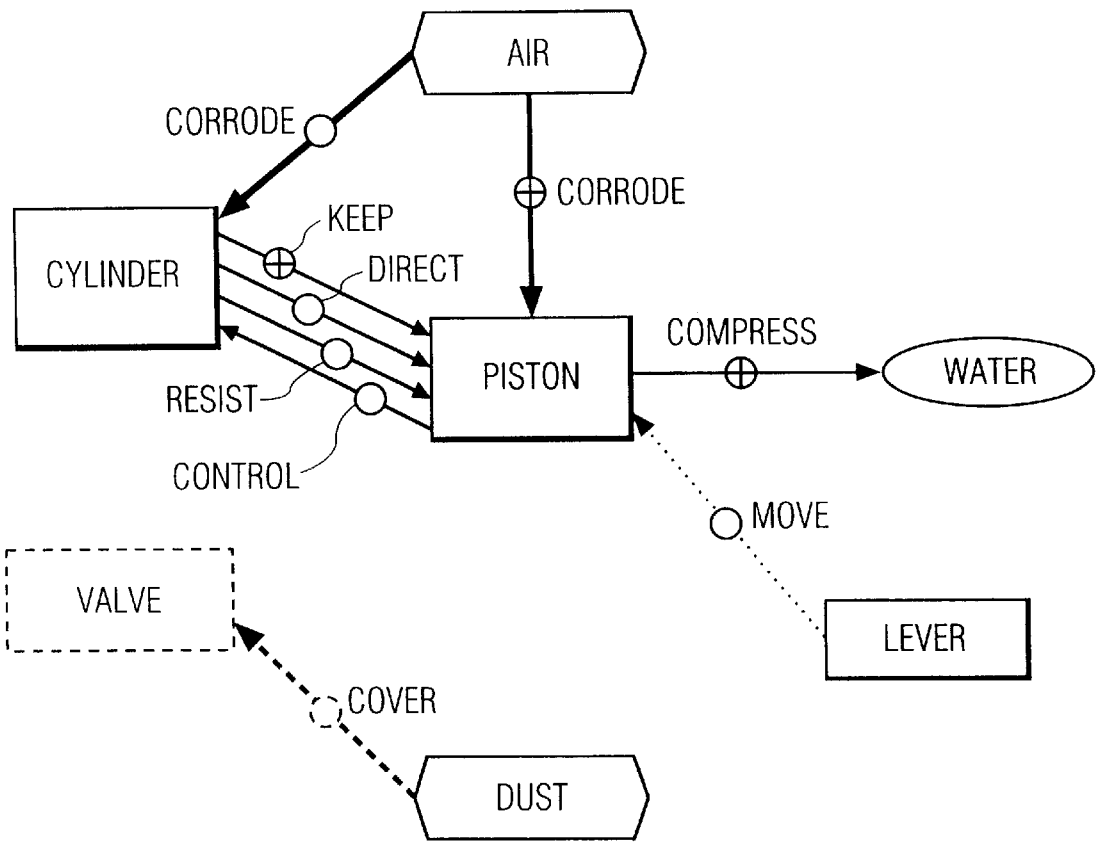
FIG. 26 is similar to FIG. 12 and displays the trimmed functional model of the object system.

The EAS next displays the Trimming Condition for the recommended or selected Trimmed component, e.g. the valve and the possible trimming variant, e.g. the piston. See FIG. 25, where the related action "control" is also selected. The transfer of this action to another component, and in this example, "control" of the cylinder is transferred to the action between "piston" and "cylinder." This selection is accomplished by clicking on the upper button 20 and selecting "piston" from the menu bar 22. The trimming condition data was entered via unit 260 in FIG. 1 that applies this data to unit 270 as described above. Unit 270 then modifies the original Functional Model data stored in unit 280 with the trimmed Model Data stored in unit 280 is displayed via unit 285 and fed to the Problem Manager unit 230 and Report Generator 210. FIG. 26 shows the trimmed functional model generated from the data stored in unit 280. Note the valve box is drawn in phantom because it was eliminated and no interaction exists between valve and cylinder. Note also that cylinder "control" has become an interaction between piston and cylinder. Cover and dust (harmful elements) also disappeared and are shown in phantom.

It is important to understand that the user and the EAS to this point in the session have encountered any psychological inertia that may prevent innovative thinking. The object system has been dissected, evaluated and analyzed in it purest sense. The EAS, after analysis, has recommended to the user that the greatest valve of redesign will result if the cylinder control action is transferred to the piston and the valve eliminated. How the piston itself can perform this added function becomes the problem statement to be managed by the EAS, Problem Manager.

The user now enters EAS Problem Manager that automatically generates a list of problems to be solved. Problem Manager is a tool that helps the user browse through all the problems associated with the trimmed functional model and to sort them based on value priority. Since the number of problems can be rather large, EAS calculates their significance and sorts them accordingly.

To start Problem Manager, the user clicks Problem Manager under Solution Tools in the Navigation window and the Table of Problems of FIG. 34 is displayed. This table includes the problem Number assigned by Problem Manager, the significance generated by EAS of the problem, that is relative value if solved, the EAS generated group or type of problem solution objective and the team member responsibility to be entered by the user if desired. The star 26 in the left hand column is placed by the EAS and means that this problem need not be solved if an element or function were trimmed. The user can highlight each problem number and the EAS lists the problem statement in box 28. FIG. 34 lists the problems by problem number, but if the column heading "significance" is clicked upon, then the EAS will sort and list all table entries in order of "significance", not shown.

The EAS enables the user to search for problems associated with actions, components or supersystems of the functional model. For example, FIG. 34 shows "by element name" selected and "air" entered and problem 11. highlighted. If the menu arrow 30 were clicked, other components and elements would be listed and any one of those selected and entered with the entered element problem data being displayed and highlighted in the table selection "by action name" can also be selected by the user. Problem data and evaluation take place in units 220, 200, and 230 of FIG. 1 as described above.

The EAS also includes a Feature Transfer routine that enables the user to analyze the best feature or functions or alternate elements or alternate systems and compare those desirable alternate functions or elements to the function or element in the user's functional model function or element This enables the user to analyze the alternate system to determine why specific elements yield better performance or parameters and identifies those features and operating principles that provide the better performance. With this understanding, the user then formulates problems in an attempt to transfer the better performing feature to the object system being designed or redesigned by the user.

Figures 35, 36:
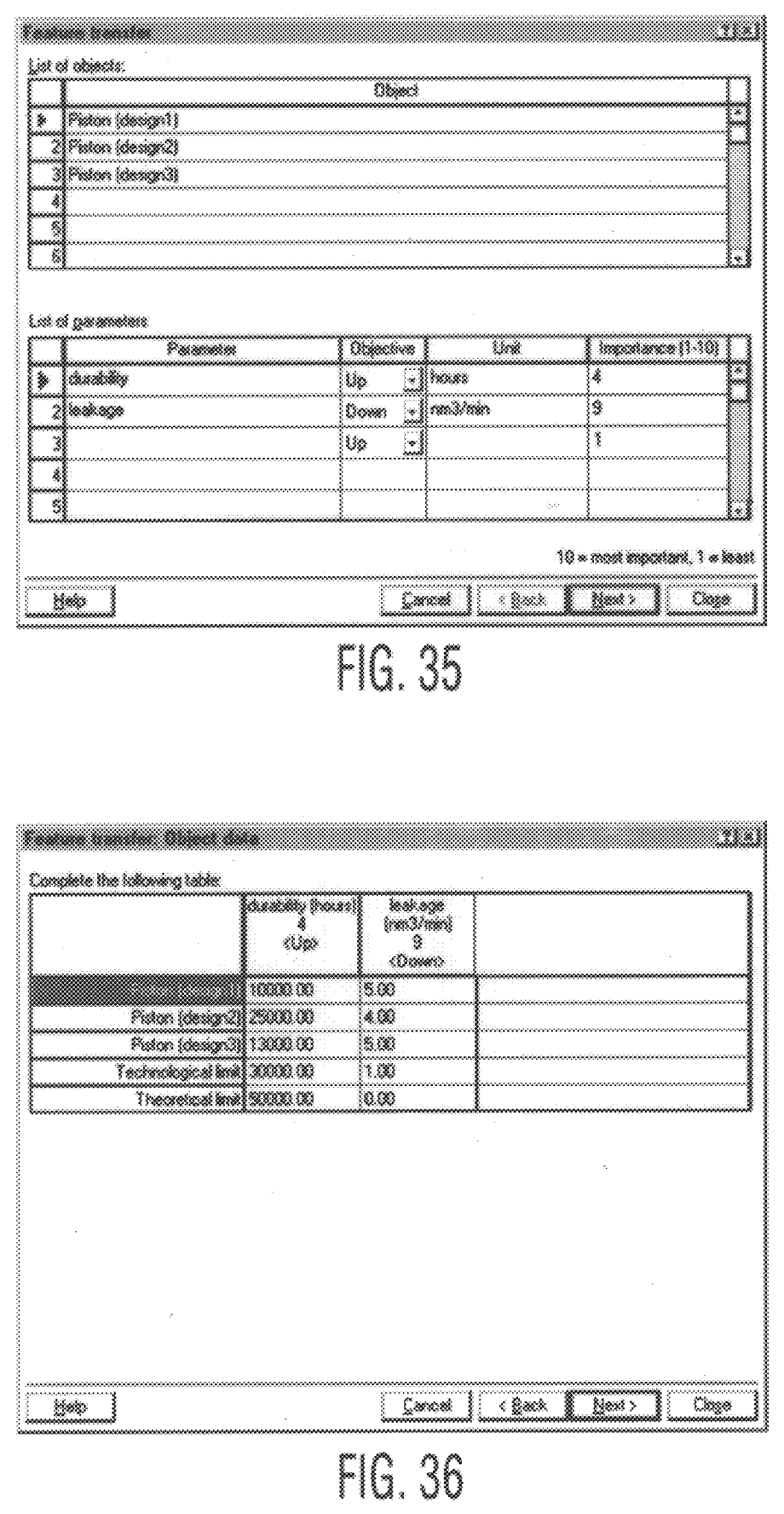

The first Feature Transfer screen, FIG. 35, is displayed when Feature Transfer is selected from the "Tools" icon on the menu bar. The user enters the object or component to be analyzed such as piston 1, 2 and 3 as shown. One of these, e.g. piston 2, may be the piston from the current object system under evaluation by the EAS. The other pistons may be from other known pump models. User then enters the important parameters 1, 2, and 3 (or more), such as leakage resistance, etc., that user wants to improve in his/her pump. The arrow buttons in the objective column 30 enables user to indicate the increase or decrease objective for each parameter. Parameter units are entered by the user and the user enters the importance rank (10=most important; 1=least important) in the right column for each parameter. User clicks to the next screen, FIG. 36, where user completes the table by entering numerical values for each parameter of each object. The Technological limit of a parameter is the value that the parameter could achieve if every modern technological achievement was used in designing the object. The Theoretical limit of a parameter is the best value that the parameter could achieve according to scientific theory. To finish the analysis and save the information to a report, the user clicks next button which brings up FIG. 37.

Figure 37:
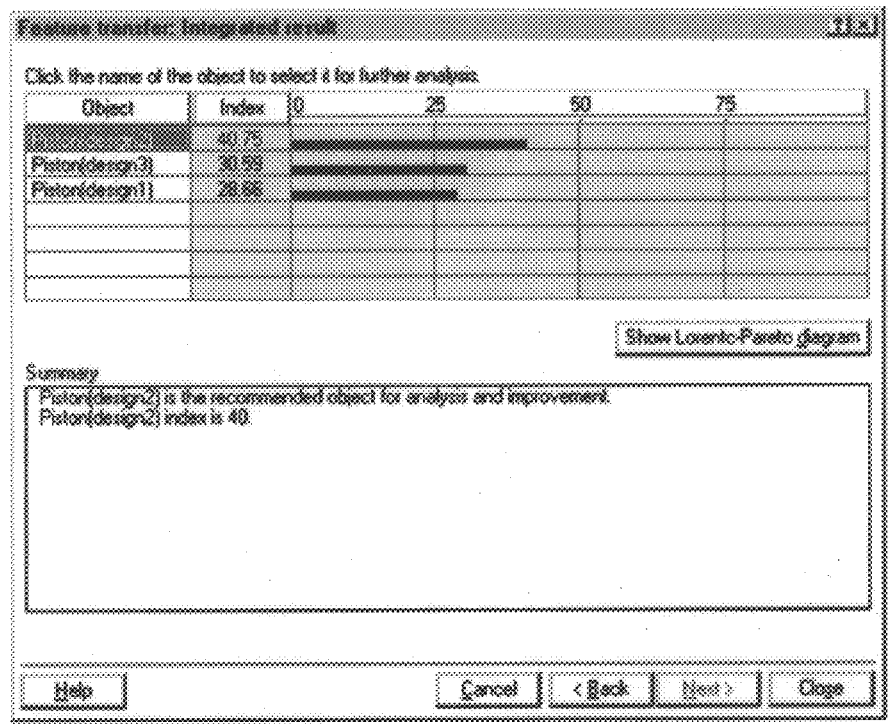
FIG. 37 is a visual display screen illustrating a display screen for inputting data and displaying feature transfer Integrated Result.

The EAS Feature Transfer Routine analyzes the feature transfer data for piston 1, 2 and 3, integrates, displays the integrated results in FIG. 37 by listing piston 1, 2 and 3 and assigning an EAS calculated relative performance index for each based upon a 100% total. The algorithm for Feature Transfer calculation is:

$$I = \frac{(K_i * P_i) * 100}{\sum (K_i * P_i)}$$

I—index;
$K_i$—parameter importance;
$P_i$—parameter value that is calculated as a percentage of sum of all parameter values.

Figure 38:
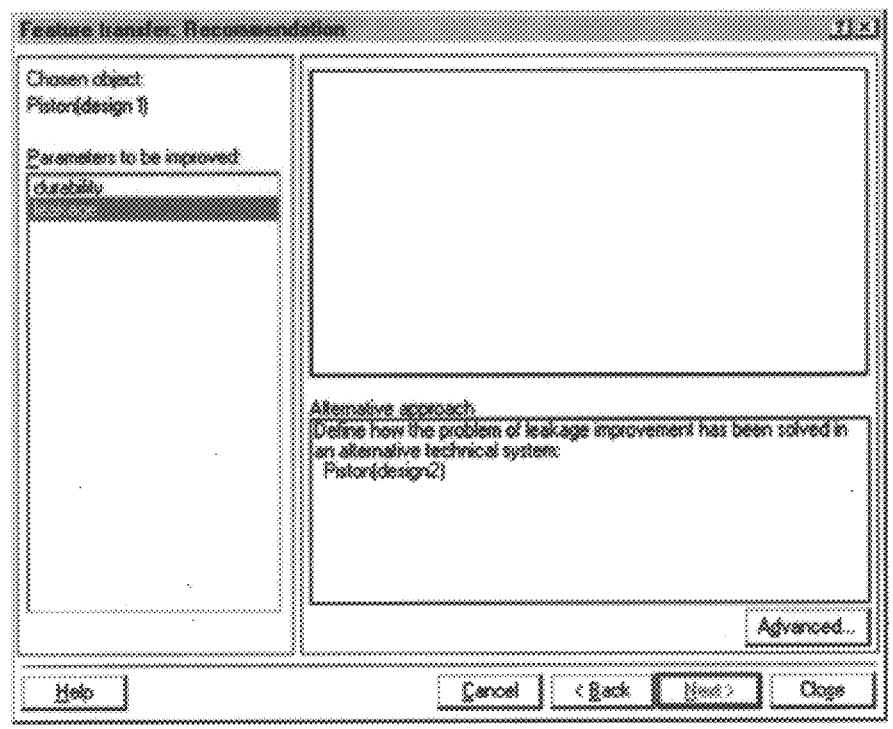
FIG. 38 is a visual display screen illustrating a display screen for inputting data and displaying feature transfer Recommendation.

Objects can be sorted by object number or index number by clicking the "Object" or "Index" box at the top of the column. User clicks next to get to the feature transfer recommendation screen, FIG. 38. This screen provides short recommendations about how to improve the parameters of the chosen object using two different approaches: leading domain of technology and alternative system approach. The user clicks the name of the parameter to be improved, e.g. leakage, and EAS displays the short recommendations for the leading domain of technology and the Alternative approach. To get advanced recommendations for the alternative approach, the user clicks Advanced . . . near this recommendation.

Figure 39:
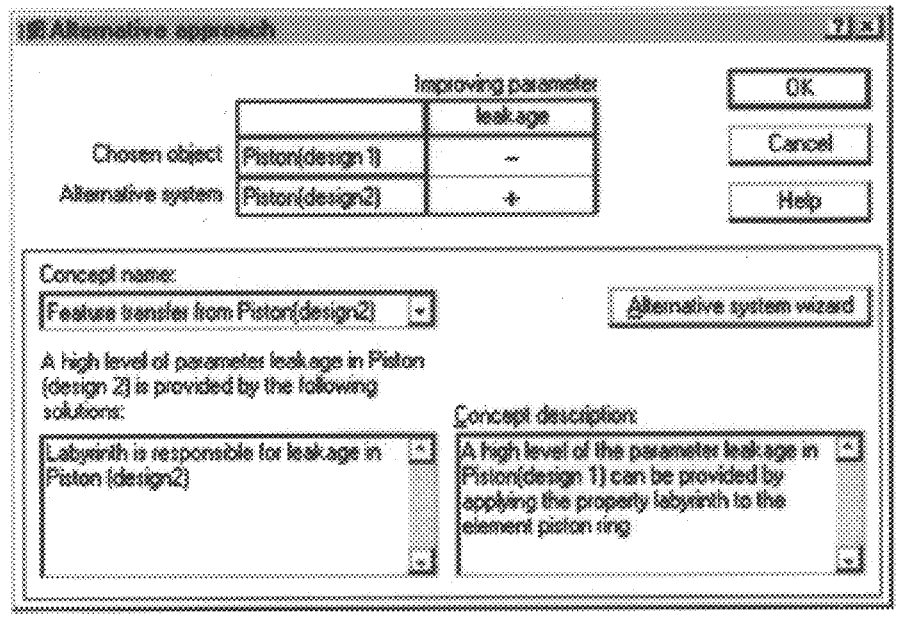
FIG. 39 is a visual display screen illustrating a display screen for inputting data and displaying feature transfer advanced alternative approach.
Figure 40:
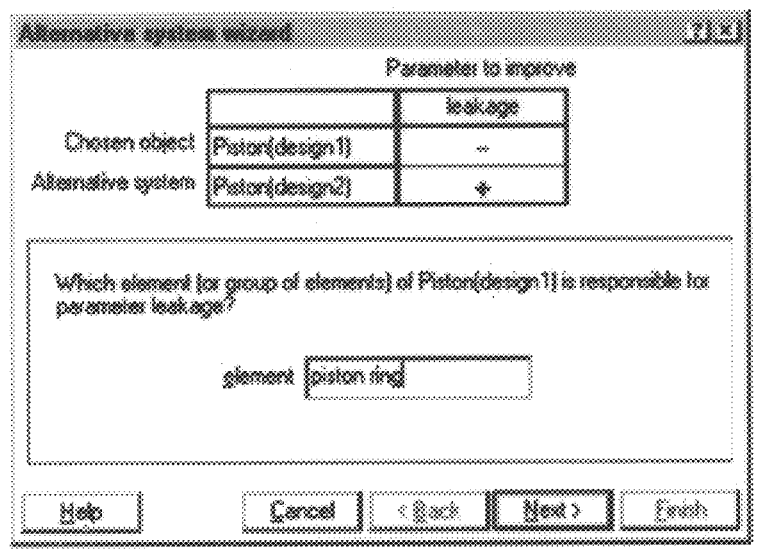
FIG. 40 is a visual display screen illustrating a display screen for inputting data and displaying feature transfer alternative approach parameter analysis.

If the user wants the EAS to undertake a more detailed analysis of feature transfer, then the "Advanced" button is selected to initiate an Alternative Approach subroutine and bring up FIG. 39. On this screen the user can formulate several concepts using the alternative approach by first choosing the name of the concept from the Concept name list box. A short description of the alternative solution is entered in the field below the concept name list box. Express a technical reason why the alternative object has a better level of the considered parameter. See FIG. 39. Next, a short description is entered in Concept Description of how to apply the alternative system approach to the considered object. See FIG. 39. A series of dialog boxes is displayed to lead the user through the steps of analyzing a solution in an alternative system by clicking on Alternative system wizard box. To close the dialog box and save the information to a report to memory, click OK. This will initiate a subroutine that presents four screens in sequence each asking a detailed question about the recommended object and listing the parameter to improve. For example, FIG. 40 asks which element(s) is responsible for leakage. User enters the name of the initial or current object system element "piston". To check the entry the user can note that if piston is trimmed, leakage is also deleted. There can be no leakage without a piston. Selecting next brings the FIG. 41 display asking user to enter the element of the original object system that performs the function connected with leakage. Here the user entered "piston ring." Selecting next displays a screen that prompts user to enter the element(s) of the alternate system (piston 2 as recommended above) that performance the desired function.

Figures 41, 42:
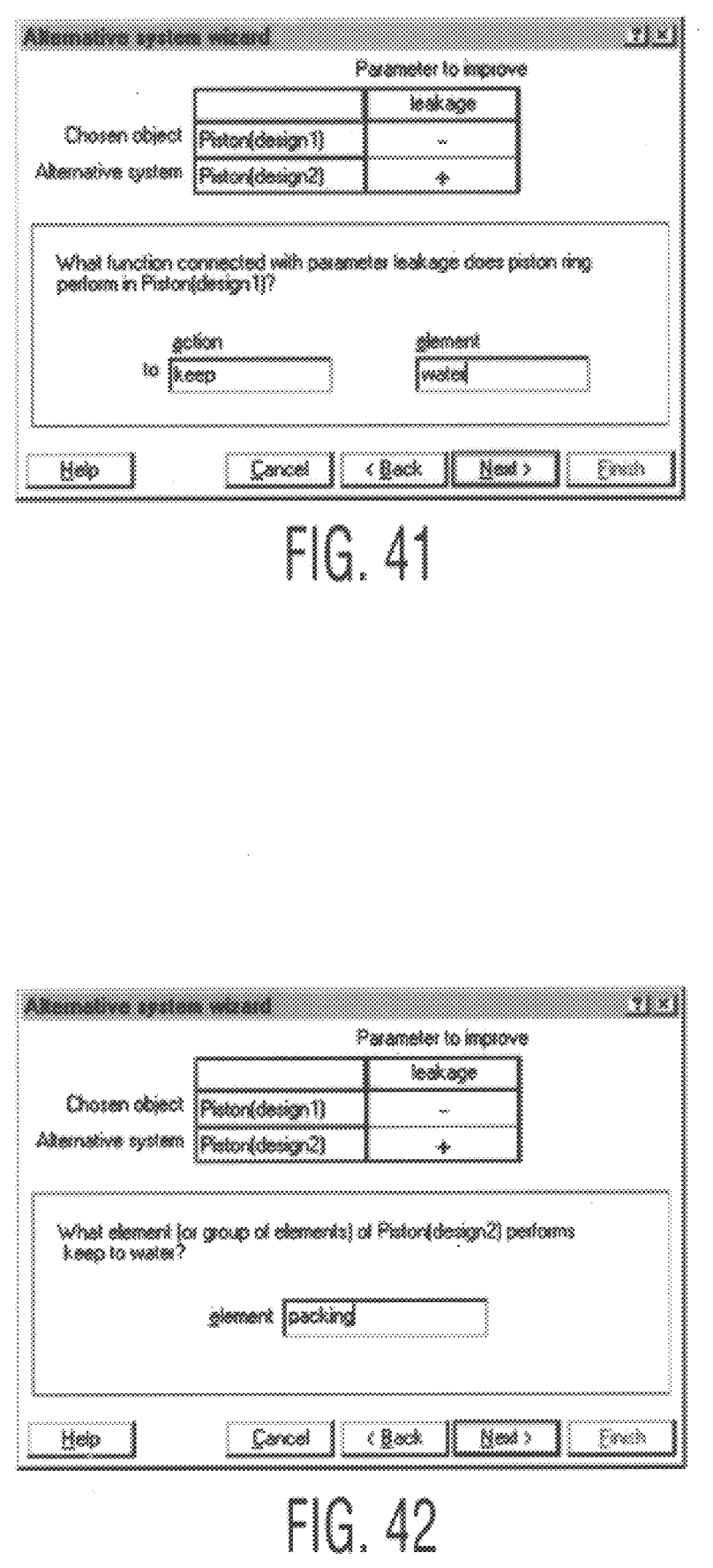
Figure 43:
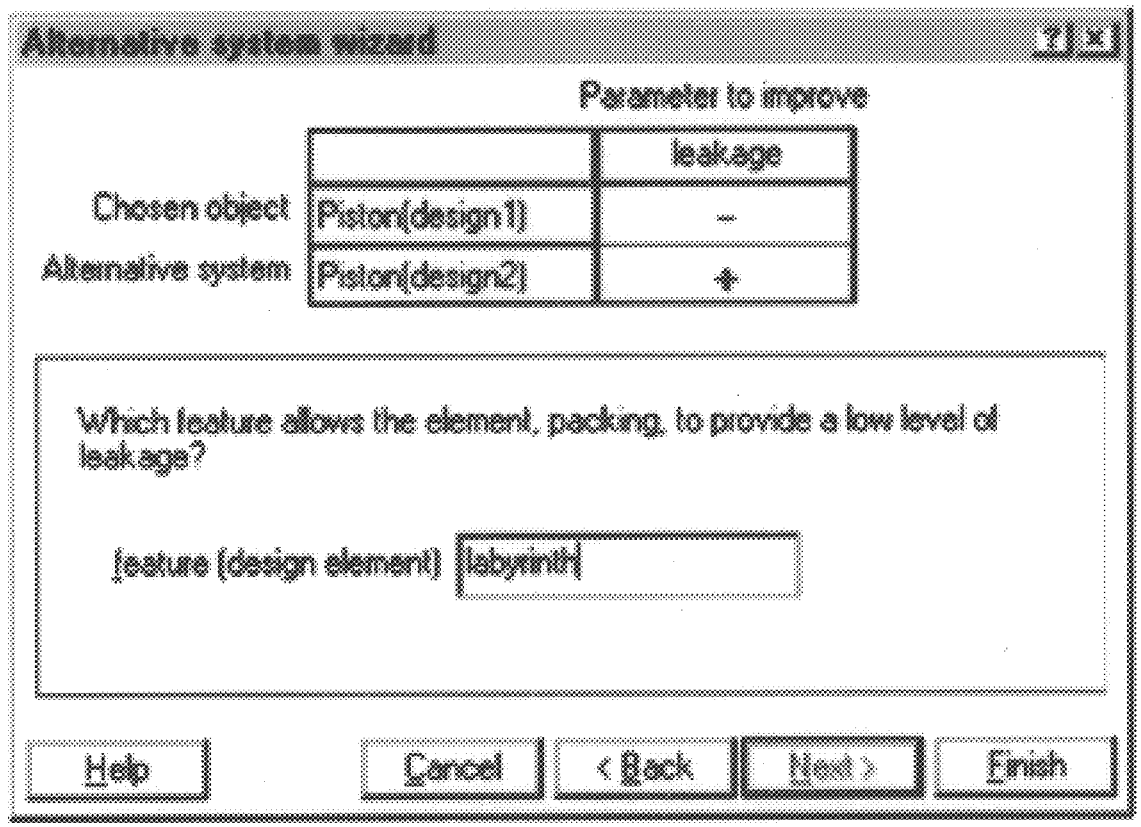
FIG. 43 is a visual display screen illustrating a display screen for inputting data and displaying feature transfer alternative approach feature analysis.
Figure 44A:
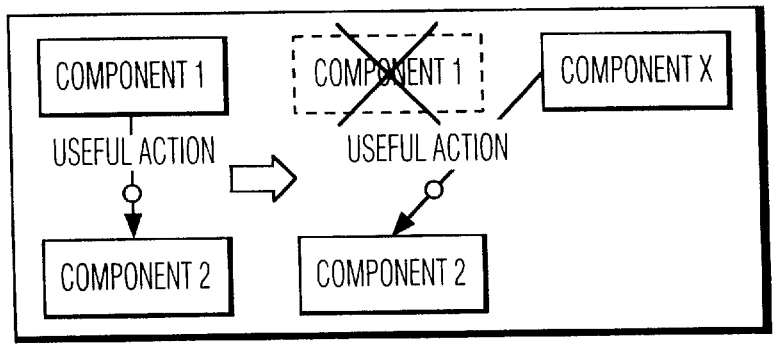
Figure 44B:
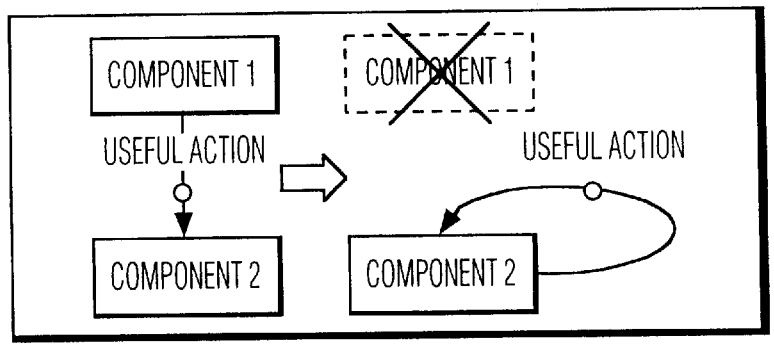
Figure 44C:
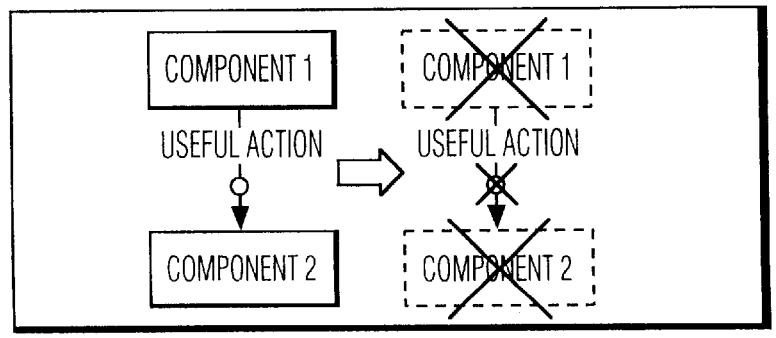
Figure 44D:
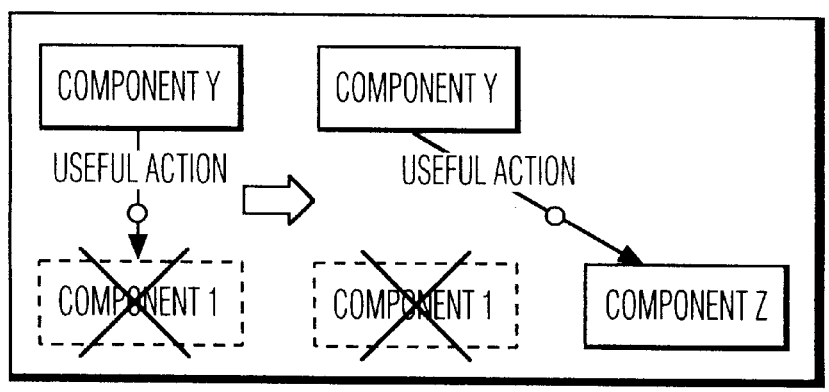
Figure 44E:
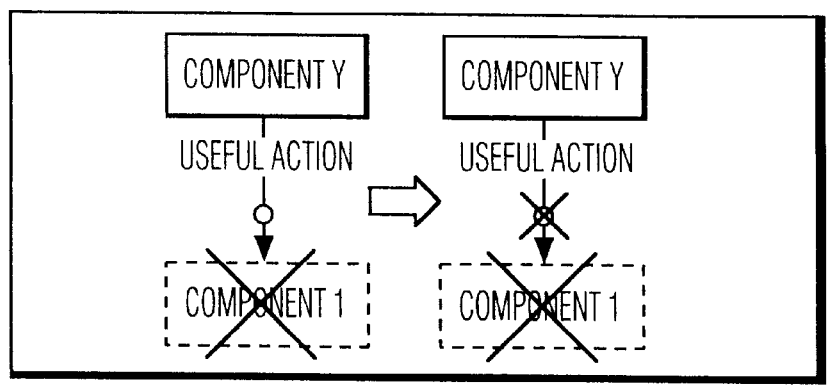

Piston 2, in this example, used packing so user enters "packing" as the "element" in FIG. 42. Selecting next displays the FIG. 43 screen prompting entry of the specific "property" of the element "packing" in the alternative system (piston 2) to achieve a high level of "leakage" meaning high level of leakage control. User entered labyrinth in the feature box.

Whether or not feature transfer is used, the EAS unit 210 can generate a report by organizing and managing the information from the various and predetermined subroutines in the usual manner. Preferably a Report icon is displayed as part of the EAS navigation window and includes a "Generate" command that can be clicked to initiate the report. Parts of a report can be edited just as any word processing program can be edited.

The EAS hereof can be programmed by one of ordinary skill in the art using the following commercially available tools:
1. Borlan C++, Development Suite for Windows 95 NT, 3.1 and DOS V 5
2. NeoAccess Developers Tool Kit V 4
3. TGRID V 1.4 and 1.5 Henry PICOT, Inc.
4. TE Developer Kit WIN 32 V 5.0 Subsystems, Inc.
5. SPELL TIME V 2.0 Susystem, Inc.

It should be understood that the screens have cancel and finish buttons and allow user editing of displayed data function in the usual manner. If the user do not want to save the entered data to a related file in the memory unit, the user selects "cancel", and, if the user wants to save the entered data, the user selects "Finish".

It will also be understood that various modifications and changes can be made to the herein disclosed exemplary embodiment without departing from the spirit and scope of the present invention.

GLOSSARY

Acceptable deviation shows how much variance from the prescribed values is allowed.
Acceptable time (space, parameter) dependency of harmful action parameter is the value that provides an acceptable level of damage for the object under consideration.
Acceptable value of harmful action parameter is the value that provides an acceptable level of damage for the object under consideration.
Actual time (space, parameter) dependency of useful parameter is a dependency that the parameter has.
Actual value of parameter is a value that the parameter has on the object life stage.
Alternative System is a set of design rules or principles related to a specific component of an object system.
Auxiliary function is a useful function directed toward a component of the engineering system being considered.
Basic function is a useful function of a component of an engineering system, directed toward the system's main object.
C is the cost of an object system component or A–D quadrant ranking for trimming candidacy.
Component is a part of the object to be analyzed.
EAS—Engineering Analysis System software on a storage medium, method or programmed computer
Excessive intensity of action is a situation when the actual intensity exceeds the required one.
F—Functional rank of each component of the object system.
Feature transfer is transfer of a beneficial design feature from a first component design to a second component design in order to improve the second component function or parameter or reduce a harmful effect related to the second component.
Function is an action of a material object that effects change on the parameters of another material object.
Function carrier—component that performs a function.
Function object—component on which the action of a function is executed.
Function rank of component is the sum of the ranks of functions performed by this component.

EAS calculates the function rank of a component. Function rank is determined according to the diagram in FIG. 45.
Note:
Functional ranks of components are calculated using formal features only. If the user does not agree with the calculated values of functional rank, the user may enter his/her own evaluations.

Functional Model—A collection of data representing the object in the forms of defined components, supersystems and products and interactions among components, supersystems, and products Harmful action is an action that adversely affects the functioning of an object in different life stages.

Harmful function—function that adversely affects parameters or performance of the function object.

Ideal value of harmful action parameter is the value that provides absence of damage for the object under consideration.

Insufficient intensity of action is a situation when the required intensity exceeds the actual one.

Integrated Component Evaluation—a subroutine that evaluates relatively each component F, P, C and C+P, compares the results and charts the results in quadrants A, B, C or D as a recommendation for trimming.

Main function—a useful function of an object, the fulfillment of which is the ultimate goal.

Model Data—data forming a part of the Functional Model

Normal intensity of action is a situation when the actual intensity coincides with the required one.

Object System—the object, device, process, machine or other engineering system that the user wants to analyze, design or redesign.

P—problem rank for each component of the object system.

Problem rank of component is the sum of the ranks of the problems connected with this component.
  EAS calculates the problem rank of a component.
  The rank of the problem depends on several factors. See FIG. 46.

Product is engineering objects or parts thereof, natural objects of parts thereof. Interaction with the product reflects the main destination of the object.

Rank of function—relative importance of a function in the fulfillment of the main function of the engineering system.

Required time (space, parameter) dependency of parameter is a dependency that the parameter should have.

Required value of parameter is a value that the parameter should have.

Sizing handle—a small green square that appears at each corner and along each side of a rectangular area and surrounds the selected element. Drag a sizing handle to resize the element.

Supersystem—an environment element or substance inherently present and interacting with one or more components of the object.

Supersystem element is an engineering system, personnel, or an environment that interacts with the object to be analyzed.

Trim or Trimming—elimination of a component or action from the Functional Model

Trimmed Functional Model—a collection of data representing the object after a component or action has been trimmed or modified.

TS—Task Significance

Useful action is an action that the object needs to have to function in different life stages.

Useful function—function that satisfies the user requirement by means of a function carrier.

LEGEND For FIG. 1

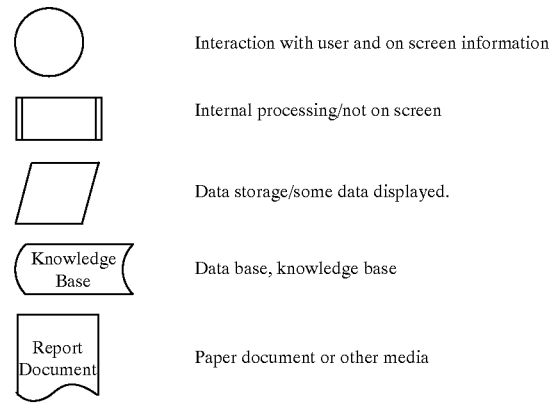

Interaction with user and on screen information

Internal processing/not on screen

Data storage/some data displayed.

Data base, knowledge base

Paper document or other media

LEGEND For FIG. 32

| Browser: Function table | |
|---|---|
| Project: | Pump developing |
| Object: | Pump |
| Legend | |
| B - basic action | |
| An - auxiliary function of rank "n" | |
| H - harmful action | |
| D - dependency discrepancy | |
| V - value discrepancy | |
| E - excessive level | |
| I - insufficient level | |
| N - normal level | |

LEGEND For FIGS. 12 and 26

| TRIMMED FUNCTIONAL MODEL Object structure after trimming | |
|---|---|
| Project: | Pump developing |
| Object: | Pump |

We claim:

1. A computer program embodied on a computer readable storage medium comprising an engineering analysis system for analyzing an object system, said engineering analysis system comprising:

a functional model unit responsive to user entry for generating on the computer screen a visual representation of a functional model of the object system including said functional model components, environmental elements and products, and further responsive to user entry for generating on a computer screen representations of the interactions between the generated components, elements, and products, each interaction being designated for visual representation as either harmful or useful, and wherein said functional model is represented on the screen, said functional model unit including a link analysis unit which in response to user entry applies a visual designation of one of at least three characteristics to each interaction, and wherein said link analysis unit includes an advanced link analysis unit for prompting user entry, storing, and displaying of (i) a parameter of at least one of said interactions, (ii) the actual and desired values of said parameter, (iii) a dependency of said parameter.

2. A computer program on a computer readable storage medium according to claim 1 wherein said functional model unit comprises a graphical representation unit responsive to user entry for generating component, environmental element, and product representative images in user determined locations on the screen and the interactions among components and elements being represented by lines extending between components and between components and elements.

3. A computer program on a computer readable storage medium according to claim 1 wherein said functional model unit comprises a matrix representation unit responsive to user entry for generating components, environmental elements, and product on each of the X and Y axes of a matrix representation and rows and columns of entry boxes, each component, environmental element, and product representation being entered in a row box and column box, said matrix representation unit displaying representation of useful interactions and harmful interactions, and said matrix representation unit being responsive to user entry for displaying representations of one or more harmful and useful actions in each box representing at least one intersection of components, environmental elements, or product on the X axis with the components or elements in the Y axis.

4. A computer program embodied on a computer readable storage medium according to claim 1 wherein said dependency includes a time dependency and a space dependency.

5. A computer program embodied on a computer readable storage medium according to claim 4 wherein said time and space dependencies are represented in graphical representation.

6. A computer program embodied on a computer readable storage medium according to claim 1 wherein said actual and desired values comprise quantitative values with designated tolerances.

7. A computer program embodied on a computer readable storage medium comprising an engineering analysis system for analyzing an object system, said engineering analysis system comprising:

a functional model unit responsive to user entry functional model data for storing and displaying on the computer screen a functional model of the object system including components, environmental elements and products and useful and harmful interactions, said functional model including a link analysis unit for responding to user entry for generating interaction data including desired and actual useful interaction data and desired and actual harmful interaction data, a trimming unit responsive to functional model data and interaction data for generating a trimming recommendation rank for each functional model component and displaying representations of said trimming recommendation rank on the screen.

8. A software system according to claim 7, wherein said trimming unit comprises a Trimming parameter unit for prompting the user to enter for each component F, P, C data representing its respective function rank, problem rank and cost, and an F, P, TS evaluation unit in response to F, P, C data, functional model data and interaction data for generating, storing and displaying the function rank, problem rank and task significance for each functional model component, and an integrated component evaluation unit responsive in part to said function rank, problem rank and task significance for generating a trimming rank for each component and for displaying representation of the trimming ranks on the screen.

9. A software system according to claim 8, wherein said trimming unit comprises a trimming condition evaluation unit responsive in part to functional model data and the trimming rank of each component for generating trimmed components and interactions and transfer interaction to another component recommendation, and a trimmed model data unit responsive to said trimmed unit component and transfer interaction to another component recommendation for generating a graphical representation of a trimmed functional model representing trimmed components and interactions differently from corresponding components and interactions in the displayed functional model and representing recommended transferred interactions between at least one component remaining after the recommended trimmed component is represented as being trimmed.

10. In a digital computer system, the method of analyzing an object system comprising:

generating and displaying on the computer monitor a visual representation of a functional model of the object system including functional model components, environmental elements, and products, generating and displaying on the computer monitor representations of the interactions between the displayed components, environmental elements, and products and visually designating each interaction as harmful or useful, said steps of generating and displaying the component, environmental element representations comprising being positioned in user determined locations on the computer monitor and the interactions among components and environmental elements and products being represented by lines extending between components and between components and environmental elements and products, and link analyzing each interaction representation and designating and displaying one of at least three characteristics in association with each interaction line on the monitor, and advanced link analyzing the interactions by storing and displaying (i) a parameter of a at least one of the interactions, (ii) the actual and desired values of said parameter, and (iii) a dependency of said parameter.

11. The method according to claim 10, further including generating and alternately displaying a matrix form functional model representation that comprises a matrix representation responsive to user entry for generating components and environmental elements on each of the X and Y axes of the matrix representation and rows and columns of entry boxes, each component or element representation being entered in a row box and column box, displaying in said matrix representation representations of useful interactions and harmful interactions, and said matrix representation being responsive to user entry for displaying representations of or one or more harmful and useful actions in each box representing at least one intersection of components, environmental elements on the X axis with the components, environmental elements, and product in the Y axis, and wherein said generating and displaying steps include the data entered in said matrix during said generating and alternately displaying step and the generating and alternately displaying step includes the data entered during said generating and displaying steps.

12. A method according to claim 10 wherein said dependency includes a time and a space dependency.

13. A method according to claim 12 wherein said time and space dependencies are displayed in graphical representations.

14. A method according to claim 10 wherein said actual and desired values comprise quantitative values with designated tolerances.

15. In a digital computer system, the method of analyzing an object system comprising:

generating, responsive to user entry, functional model data and storing and displaying on the computer screen a functional model of the object system including components, environmental elements, and products and useful and harmful interactions, generating, responsive to user entry, link analysis data for generating and displaying interaction data including desired and actual useful interaction data and desired and actual harmful interaction data, and generating trimming data responsive to functional model data and interaction data and generating a trimming recommendation rank for each functional model component and displaying representations of said trimming recommendation rank on the screen.

16. A method according to claim 15, wherein said trimming data comprises trimming parameter data for prompting the user to enter for each component F, P, C data representing its respective function rank, problem rank and cost, and evaluating the F, P, TS data in response to F, P, C data, functional model data and interaction data and generating, storing and displaying the function rank, problem rank and task significance for each functional model component, and evaluating said function rank, problem rank and task significance data and partially in response thereto generating a trimming rank for each component and for displaying representation of the trimming ranks on the screen.

17. A method according to claim 16, wherein said trimming data comprises a trimming condition evaluation data responsive in part to functional model data and the trimming rank of each component and generating trimmed components and interactions and transfer interaction to another component recommendation, and generating trimmed model data responsive to said trimmed data component and transfer interaction to another component recommendation and generating a graphical representation of a trimmed functional model representing trimmed components and interactions differently from corresponding components and interactions in the displayed functional model and representing recommended transferred interactions between at least one component remaining after the recommended trimmed component is represented as being trimmed.

* * * * *